(12) United States Patent
Mun et al.

(10) Patent No.: US 10,013,349 B2
(45) Date of Patent: *Jul. 3, 2018

(54) MEMORY CONTROLLER, METHOD THEREOF, AND ELECTRONIC DEVICES HAVING THE MEMORY CONTROLLER

(71) Applicant: SAMSUNG ELECTRONICS CO., LTD., Suwon-si, Gyeonggi-do (KR)

(72) Inventors: Kui-Yon Mun, Hwaseong-si (KR); Hwa Seok Oh, Yongin-si (KR)

(73) Assignee: SAMSUNG ELECTRONICS CO., LTD., Suwon-si, Geonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/875,205

(22) Filed: Oct. 5, 2015

(65) Prior Publication Data

US 2016/0034390 A1 Feb. 4, 2016

Related U.S. Application Data

(63) Continuation of application No. 13/540,078, filed on Jul. 2, 2012, now Pat. No. 9,152,551.

(30) Foreign Application Priority Data

Jul. 8, 2011 (KR) .......................... 10-2011-0068089

(51) Int. Cl.
*G06F 12/02* (2006.01)
*G11C 16/04* (2006.01)
(Continued)

(52) U.S. Cl.
CPC ........ *G06F 12/0292* (2013.01); *G06F 3/0604* (2013.01); *G06F 3/064* (2013.01);
(Continued)

(58) Field of Classification Search
CPC ... G11C 16/0483; G11C 7/1006; G11C 16/22; G11C 29/765; G11C 29/74; G11C 16/00;
(Continued)

(56) References Cited

U.S. PATENT DOCUMENTS 6,947,960 B2 * 9/2005 Hars .......................... G06F 7/58
 708/250
8,059,455 B2 * 11/2011 Stern ................... G11C 11/5628
 365/185.02

(Continued)

FOREIGN PATENT DOCUMENTS

CN 1534454 10/2004
CN 101097550 1/2008
(Continued)

OTHER PUBLICATIONS

Komi Yama Susumu, "Review on Algorithm Can Make a Great Acceleration", Nikkei, Nikkei PB Inc., Sep. 24, 2001, vol. 4, Issue 10.

*Primary Examiner* — David Yi
*Assistant Examiner* — Francisco A Grullon
(74) *Attorney, Agent, or Firm* — F. Chau & Associates, LLC

(57) ABSTRACT

A method for operating a memory controller is provided. The method includes generating a pseudo random number by using a seed included in a stored seed group corresponding to a page to be currently programmed, wherein the stored seed group is stored among a plurality of seed groups. Data to be programmed into the current page is randomizing by using the pseudo random number and the memory controller outputs the randomized data. A solid state drive (SSD) or other memory storage device such as a memory card includes the memory controller and includes a read only memory (ROM) storing the plurality of seed groups. The memory controller includes a micro-processor and a read
(Continued)

only memory (ROM) storing executable code for causing the micro-processor to access the plurality of stored seed groups and to select a seed therefrom corresponding to a page to be currently programmed.

20 Claims, 20 Drawing Sheets

(51) Int. Cl.
*G11C 16/22* (2006.01)
*G06F 3/06* (2006.01)

(52) U.S. Cl.
CPC ........ *G06F 3/0679* (2013.01); *G06F 12/0246* (2013.01); *G11C 16/0483* (2013.01); *G11C 16/22* (2013.01); *G06F 2212/202* (2013.01); *G06F 2212/7207* (2013.01); *H01L 2224/32145* (2013.01); *H01L 2224/48091* (2013.01); *H01L 2224/48145* (2013.01); *H01L 2224/48227* (2013.01); *H01L 2224/73265* (2013.01); *H01L 2924/12044* (2013.01); *H01L 2924/15311* (2013.01); *H01L 2924/181* (2013.01)

(58) Field of Classification Search
CPC .. H03M 13/03; G06F 12/06; G06F 2212/251; G06F 12/0246; G06F 11/1666; G06F 11/20; G06F 7/584; G06F 7/724; G06F 11/1012; G06F 7/58; G06F 11/1048
See application file for complete search history.

(56) References Cited

U.S. PATENT DOCUMENTS

| 8,261,159 | B1* | 9/2012 | Sommer | G06F 11/1048 713/193 |
|---|---|---|---|---|
| 2004/0158591 | A1* | 8/2004 | Crispin | G06F 7/588 708/250 |
| 2004/0205352 | A1* | 10/2004 | Ohyama | G06F 21/85 713/194 |
| 2009/0083485 | A1* | 3/2009 | Cheng | G06F 11/1666 711/114 |
| 2009/0193065 | A1* | 7/2009 | Vijayarangan | G06F 7/582 708/209 |
| 2009/0204824 | A1* | 8/2009 | Lin | G06F 12/0246 713/193 |
| 2009/0316490 | A1* | 12/2009 | Takada | G11C 7/1006 365/185.26 |
| 2009/0323942 | A1* | 12/2009 | Sharon | G11C 7/1006 380/44 |
| 2010/0217921 | A1* | 8/2010 | Mun | G06F 11/1072 711/103 |
| 2011/0119432 | A1* | 5/2011 | Yoon | G11C 7/1006 711/103 |
| 2011/0161678 | A1* | 6/2011 | Niwa | G06F 12/1408 713/193 |
| 2011/0238891 | A1* | 9/2011 | Chen | G06F 12/0246 711/103 |
| 2012/0226887 | A1* | 9/2012 | Culley | G06F 12/0246 711/202 |
| 2012/0278529 | A1* | 11/2012 | Hars | G06F 12/0246 711/103 |
| 2013/0219247 | A1* | 8/2013 | Yang | G06F 11/1048 714/766 |

FOREIGN PATENT DOCUMENTS

| CN | 101663642 | 3/2010 |
|---|---|---|
| JP | 2011508363 | 3/2011 |
| WO | 2005050909 | 6/2005 |

* cited by examiner

FIG. 8

| SEED TABLE | ~ST21 |
| ZONE15 | PADD [3:0] = 1111 |
| ⋮ | |
| ZONE2 | PADD [3:0] = 0010 |
| ZONE1 | PADD [3:0] = 0001 |
| ZONE0 | PADD [3:0] = 0000 |

MEMORY CONTROLLER, METHOD THEREOF, AND ELECTRONIC DEVICES HAVING THE MEMORY CONTROLLER

CROSS-REFERENCE TO RELATED APPLICATIONS

This application is a continuation application of U.S. application Ser. No. 13/540,078 filed Jul. 2, 2012, which claims priority under 35 U.S.C. § 119(a) to Korean Patent Application No. 10-2011-0068089 filed on Jul. 8, 2011, which disclosures of which are each hereby incorporated by reference herein in their entireties.

BACKGROUND

1. Field

Embodiments of the present inventive concept relate to a memory controller, and more particularly, to a memory controller which may reduce seed correlation between a plurality of pages adjacent to each other, an operation method of the memory controller, and electronic devices having the memory controller.

2. Description of the Related Art

Pseudo-random numbers are widely used in a communication system or a data storage system. The pseudo random numbers are used to generate a pseudo random sequence.

Thus, a pseudo random number means a number generated by pre-determined mechanism, e.g., a pseudo random number generator by using an initial value given at first.

Since a generation method of a really random number is not determinate, it is hard to predict the next value to be generated, i.e., a number. However, a number generated by a pseudo random number generator may be calculated from an initial value of the pseudo random number generator, so it is called a pseudo random number to distinguish from a real random number.

A linear feedback shift register (LFSR) is used to generate a pseudo random number sequence. The LFSR may change the pseudo random number sequence by changing an initial value called seed or changing feedback taps.

As described above, a pseudo random number may be calculated by using an initial value, so that the pseudo random number may be calculated.

However, a generation method in which a pseudo random number that may not be calculated easily may be desirable in a communication system or a data storage system. A randomizer in a communication system or a data storage system changes data into randomized data by using a pseudo random number sequence generated by LFSR. In the communication system or a data storage system, a derandomizer changes randomized data into de-randomized data by using the same pseudo random number sequence generated by LFSR. Accordingly, a randomizer or a de-randomizer for a generation method in which a pseudo random number sequence may not be calculated easily is desirable in a communication system or a data storage system.

SUMMARY

An embodiment of the present inventive concepts is directed to a method for operating a memory controller, including generating a pseudo random number by using a seed included in and selected from a stored seed group (among a plurality of seed groups stored in the memory controller) corresponding to a page to be currently programmed, and randomizing data to be programmed in the page by using the pseudo random number and outputting randomized data.

According to an exemplary embodiment, a solid state drive (SSD) or other memory storage device (such as an SD memory card) includes a memory controller and includes a read only memory (ROM) storing the plurality of seed groups. The memory controller includes a micro-processor and a read only memory (ROM) storing executable code for causing the micro-processor to access the plurality of stored seed groups and to select a seed therefrom corresponding to a page to be currently programmed. The read only memory (ROM) in the memory controller storing the executable code can also store the plurality of seed groups.

According to an exemplary embodiment, the generating the pseudo random number includes selecting the seed group corresponding to page to be currently programmed among the plurality of seed groups by using at least one bit of a page address of the page, and selecting an entry, which is designated by an entry pointer among a plurality of entries included in a selected seed group, as the seed and generating the pseudo random number by using a selected seed.

The method of the memory controller further includes changing the entry pointer after an entry, which is designated by the entry pointer, is selected. When the memory controller is reset, a changed entry pointer is reset to a default value.

According to another exemplary embodiment, the generating the pseudo random number includes selecting the seed group corresponding to page to be currently programmed among the plurality of seed groups by using at least one bit of a wordline address corresponding to the page, and selecting an entry, which is designated by an entry pointer among a plurality of entries included in a selected seed group, as the seed and generating the pseudo random number by using a selected seed.

When each of the plurality of seed groups corresponds to each of a plurality of pages, the number of the plurality of pages is equal to the number of wordlines of the memory cell array times the number of bits stored in each of a plurality of multi-level cells connected to each wordline.

Another exemplary embodiment of the present inventive concepts is directed to a method for operating a memory controller, including generating a pseudo random number by using a seed included in a seed group corresponding to a page to be currently programmed among a plurality of seed groups each stored in different seed tables, and randomizing data to be programmed in the page by using the pseudo random number and outputting randomized data.

Still another exemplary embodiment of the present inventive concepts is directed to a method for operating a memory controller, including generating a pseudo random number by using a seed included in a seed group assigned to a page to be currently programmed among a plurality of seed groups, and randomizing data to be programmed in the page by using the pseudo random number and outputting randomized data. The plurality of seed groups are stored in an identical seed table and, when each of the plurality of seed groups corresponds to each of a plurality of zones including a plurality of entries, a zone corresponding to the seed group among the plurality of zones is selected according to at least one bit of a page address of the page or at least one bit of a wordline address corresponding to the page. The seed is an entry designated by an entry pointer among a plurality of entries included in the selected zone.

An exemplary embodiment of the present inventive concepts is directed to a memory controller, including a micro-processor which selects a seed included in a seed group corresponding to a page to be currently programmed among a plurality of seed groups and a randomizer generating a pseudo random number by using the selected seed, randomizing data to be programmed in the page based on the generated pseudo random number and outputting the randomized data.

The micro-processor of the memory controller selects an entry, which is designated by an entry pointer, from among a plurality of entries included in a selected seed group, as the seed and changes the entry pointer. When the memory controller is reset, a changed entry pointer is reset to a default value.

The memory controller may further include a read only memory (ROM) storing the plurality of seed groups.

According to an exemplary embodiment, the micro-processor selects the seed group corresponding to a page to be currently programmed among the plurality of seed groups by using at least one bit of a page address of the page or by using at least one bit of a wordline address corresponding to the page.

According to an exemplary embodiment, each of the plurality of seed groups is stored in different seed tables.

According to another exemplary embodiment, when the plurality of seed groups are stored in an identical seed table and each of the plurality of seed groups corresponds to each of a plurality of zones including a plurality of entries, the micro-processor selects a zone corresponding to the seed group among the plurality of zones based on at least one bit of a page address of the page or at least one bit of a wordline address corresponding to the page, and selects an entry, which is designated by an entry pointer among a plurality of entries included in the selected zone, as the seed.

An exemplary embodiment of the present inventive concepts is directed to a memory system, including a non-volatile memory device including a memory cell array having a plurality of pages, and a memory controller controlling an access operation of the non-volatile memory device.

The memory controller includes a micro-processor configured to select a seed included in a seed group corresponding to a page to be currently programmed among a plurality of seed groups, and a randomizer configured to generate a pseudo random number by using the selected seed, randomize data to be programmed in the page based on the generated pseudo random number and to output randomized data to the non-volatile memory device.

According to an exemplary embodiment, when each of the plurality of seed groups is stored in different seed tables, the micro-processor selects the seed group corresponding to a page to be currently programmed among the plurality of seed groups based on at least one bit of a page address of the page or based on at least one bit of a wordline address corresponding to the page.

The micro-processor selects an entry, which is designated by an entry pointer among a plurality of entries included in the selected seed group, as the seed.

According to another exemplary embodiment, when the plurality of seed groups are stored in an identical seed group and each of the plurality of seed groups corresponds to each of a plurality of zones including a plurality of entries, the micro-processor selects a zone corresponding to the seed group among the plurality of zones based on at least one bit of a page address of the page or based on at least one bit of a wordline address corresponding to the page, and selects an entry, which is designated by an entry pointer among a plurality of entries included in the selected zone as the seed.

The memory system is a multi-chip package including the non-volatile memory device and the memory controller.

An exemplary embodiment of the present inventive concepts is directed to a memory card, including a flash memory device including a memory cell array having a plurality of pages, a card interface for communicating with a host, and a memory controller controlling communication between the flash memory device and the card interface.

The memory controller includes a micro-processor configured to select a seed included in a seed group corresponding to a page to be currently programmed among a plurality of seed groups, and a randomizer configured to generate a pseudo random number by using the selected seed, to randomize data to be programmed in the page based on the generated pseudo random number and to output randomized data to the flash memory device.

The memory card may be a multimedia card (MMC) card or a USB flash drive.

An exemplary embodiment of the present inventive concepts is directed to a portable device, including a flash memory device including a memory cell array having a plurality of pages, a memory controller for controlling an operation of the flash memory device, and a display for displaying data output from the flash memory device according to control of the memory controller.

The memory controller includes a micro-processor configured to select a seed included in a seed group corresponding to a page to be currently programmed among a plurality of seed groups, and a randomizer configured to generate a pseudo random number by using the selected seed, to randomize data to be programmed in the page based on the generated pseudo random number and to output randomized data to the flash memory device.

An exemplary embodiment of the present inventive concepts is directed to a three-dimensional memory system, including a three-dimensional non-volatile memory device including a plurality of layers each having a plurality of pages, and a memory controller controlling an operation of the three-dimensional non-volatile memory device.

The memory controller includes a micro-processor configured to select a seed included in a seed group assigned to a page to be currently programmed among a plurality of seed groups, and a randomizer configured to generate a pseudo random number by using the selected seed, to randomize data to be programmed in the page based on the generated pseudo random number and to output randomized data.

An exemplary embodiment of the present inventive concepts is directed to a solid state drive, including a plurality of solid state memory devices each including a plurality of pages and a memory controller controlling an operation of each of the plurality of solid state memory devices.

The memory controller includes a micro-processor configured to select a seed included in a seed group corresponding to a page to be currently programmed among a plurality of seed groups, and a randomizer configured to generate a pseudo random number by using the selected seed, to randomize data to be programmed in the page based on the generated pseudo random number and to output randomized data to the page to be currently programmed.

Exemplary embodiments of the inventive concept will now be described more fully hereinafter with reference to the accompanying drawings. The exemplary embodiments may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present.

BRIEF DESCRIPTION OF THE DRAWINGS

Embodiments of the present inventive concept will become more apparent by describing in detail exemplary embodiments thereof with reference to the attached drawings in which:

FIG. 8 is a seed table including zones assigned to pages;

DETAILED DESCRIPTION OF THE EXEMPLARY EMBODIMENTS

Figure 1:
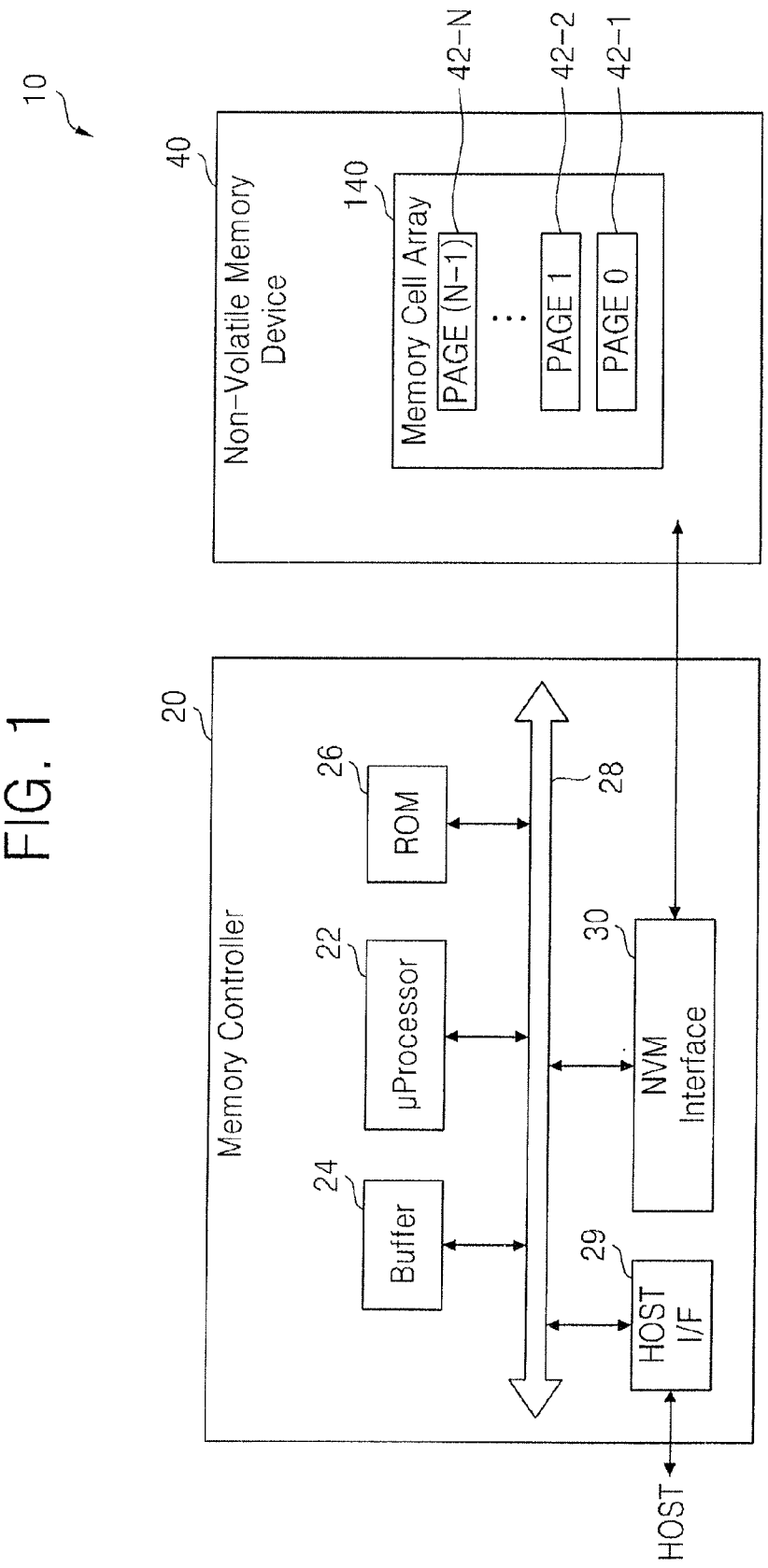
FIG. 1 is a block diagram of a memory system including a memory controller according to an exemplary embodiment of the present inventive concepts.

FIG. 1 is a block diagram of a memory system 10 including a memory controller 20 according to an exemplary embodiment of the present inventive concepts. Referring to FIG. 1, the memory system 10 includes a memory controller 20 and a non-volatile memory device 40.

The memory controller 20 controls the data access operations, (e.g., a program operation, a read operation and an erase operation), of each non-volatile memory device 40 according to external commands received from a host HOST and according to memory access algorithms (executable code) stored in the ROM 26 or in the non-volatile memory device 40. The memory controller 20 includes the ROM 26 which may store the plurality of seed groups. The ROM 26 may also store executable code for causing the micro-processor 22 to access the plurality of seed groups (stored in the ROM 26) and to select a seed therefrom corresponding to a page to be currently programmed.

Figure 6:
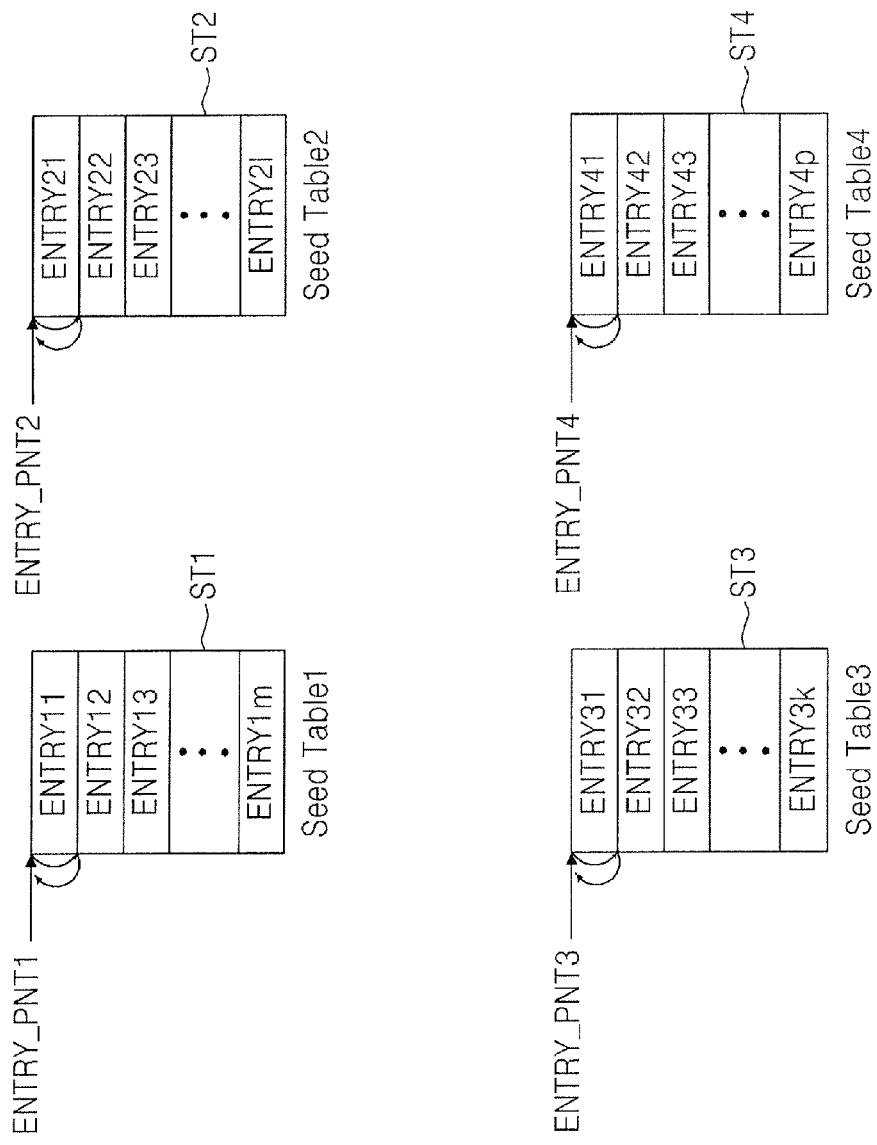
FIG. 6 is a graphic illustrating an exemplary embodiment of seed tables assigned by page.
Figure 7:
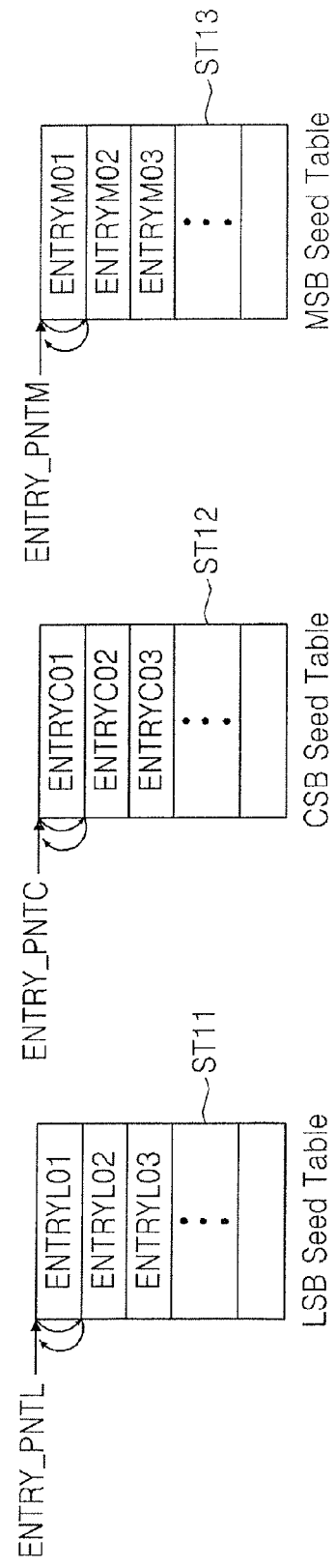
FIG. 7 is a graphic illustrating another exemplary embodiment of the seed tables assigned by page.

According to exemplary embodiments illustrated in FIGS. 6 and 7, the memory controller 20 may select a seed table on (or assigned to) a page to be currently programmed among a plurality of seed tables ST1 to ST4 and ST11 to ST13, select an entry, which is designated by an entry pointer among one or more entries included in a selected seed table, as a seed of the page, generate a pseudo random number by using a selected seed, randomize data to be programmed in the page based on a generated pseudo random number and output randomized data to the non-volatile memory device 40.

Here, it is assumed that each of a plurality of pages is influenced each other based on a floating gate coupling in a wordline direction according to a program operation, read disturbance or back-pattern dependency. Here, the read disturbance means a phenomenon that a plurality of memory cells connected to each of a plurality of wordlines which are not selected during a read operation are programmed.

Figure 9:
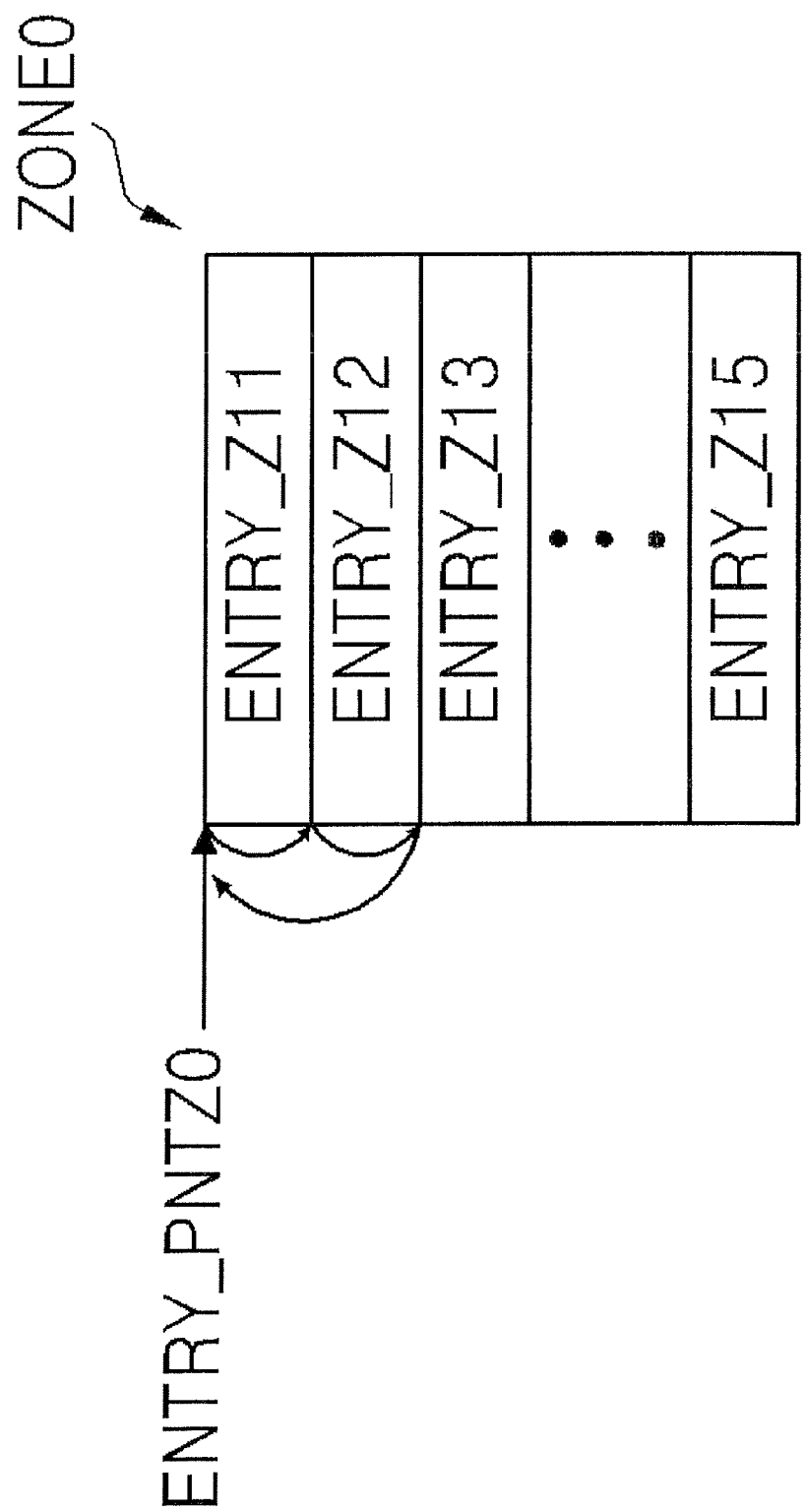
FIG. 9 illustrates entries included in one zone illustrated in FIG. 8.

According to another exemplary embodiments illustrated in FIGS. 8 and 9, a seed table ST21 includes a plurality of zones ZONE0 to ZONE15 each including a plurality of entries, the memory controller 20 may select one of a plurality of zones ZONE0 to ZONE15 assigned to each of a plurality of pages, select an entry ENTRY_Z11, which is designated by an entry pointer ENTRY_PNT Z0 among one or more entries included in a selected zone, as a seed of a page to be currently programmed, generate a pseudo random number by using a selected seed, randomize data to be programmed in the page by using the pseudo random number, and output randomized data to the non-volatile memory device 40.

The memory controller 20 includes a micro-processor 22, a buffer 24, a read only memory (ROM) 26, a host interface 29 and a memory interface 30. Each component 22, 24, 26, 29 and 30 may communicate each other through a bus 28.

The micro-processor 22 which may be embodied in a circuit, logic, a code or combination thereof may control an operation of each component 24, 26, 29 and 30.

According to exemplary embodiments illustrated in FIGS. 6 and 7, the micro-processor 22 may perform an operation selecting a seed table assigned to a page to be currently programmed among a plurality of seed tables ST1 to ST4 or ST11 to ST13, e.g., a plurality of seed tables ST1 to ST4 or ST11 to ST13 assigned by page, and/or an operation changing an entry pointer which may select one among one or more entries included in a selected seed table.

Here, the micro-processor 22 may select one of a plurality of seed tables by using at least one bit of a page address of a page to be currently programmed or at least one bit of a wordline address corresponding to the page.

According to another exemplary embodiments illustrated in FIGS. 8 and 9, the micro-processor 22 may perform an operation of selecting one of a plurality of zones ZONE0 to ZONE15 included in a seed table ST21 and/or an operation of changing an entry pointer which may select one of one or more entries included in a selected zone. According to an exemplary embodiment, a seed table ST21 may be partitioned into a plurality of independent zones.

Here, the micro-processor 22 may select one of a plurality of zones by using at least one bit of a page address of a page to be currently programmed or at least one bit of a wordline address corresponding to the page.

The buffer 24 may be implemented as a volatile memory such as a dynamic random access memory (DRAM), a static random access memory (SRAM) or a dual-port SRAM.

According to an exemplary embodiment, a plurality of seed tables may be stored in a memory cell array 140 (e.g., 140-2 or 140-3) of a non-volatile memory device 40 or a ROM 26. In this case, each of the plurality of seed tables stored in the memory cell array 140 or the ROM 26 may be loaded in the buffer 24 according to control of the micro-processor 22. Here, when a plurality of pages 42-1 to 42-N are grouped into a plurality of groups, each one of the plurality of seed tables may correspond to one group among the plurality of groups.

According to another exemplary embodiment, one seed table ST21 including a plurality of zones ZONE0 to ZONE15 may be stored in the memory cell array 140 or in the ROM 126. In this case, the one seed table ST21 stored in the memory cell array 140 or in the ROM 126 may be loaded in the buffer 24 under the control of the micro-processor 22.

For example, a seed table by page or one seed table may be loaded in the buffer 24 during a power up operation of the memory controller 20 or at real time during an operation of the memory controller 20.

The ROM 26 stores a program code implementing the memory access algorithms necessary for an operation of the memory controller 20 according to exemplary embodiments. As described above, a seed table assigned by page or one seed table may be stored in the ROM 26.

The host HOST and the memory controller 20 may communicate through a host interface 29. The host HOST may transmit a program request and data to be programmed in the non-volatile memory device 40 to the memory controller 20 through the host interface 29. Here, the memory controller 20 may generate a page address of a page of the non-volatile memory device 40 where the data will be stored and/or a wordline address corresponding to the page according to the program request.

The memory controller 20 and the non-volatile memory device 40 may communicate with each other through a memory interface 30.

The memory cell array 140 of the non-volatile memory device 40 includes a plurality of memory blocks, each of the plurality of memory blocks includes a plurality N of pages 42-1 to 42-N, and each of the plurality N of pages 42-1 to 42-N includes a plurality of non-volatile memory cells, e.g., NAND flash memory cells. Each of the NAND flash memory cells may store one-bit or more.

In the non-volatile memory device 40, e.g., a NAND flash memory device, a program operation or a read operation is performed per page and an erase operation is performed per memory block.

Here, a page may mean a memory region defined as the plurality of non-volatile memory cells connected to a wordline, e.g., a plurality of NAND flash memory cells sharing the same wordline. For example, when each of the NAND flash memory cells is a single level cell (SLC) which may store one-bit, each one wordline may identify one page.

When each of the NAND flash memory cells is a multi-level cell (MLC) which may store more than two-bits, a wordline may be defined to correspond to the same number of pages as the number of bits programmed in each of a plurality of MLCs connected to the one wordline.

For example, when each of the plurality of MLCs is a two-bit MLC, the one wordline corresponds to two pages, e.g., a first page and a second page. And when each of the plurality of MLCs is a three-bit MLC, the one wordline corresponds to three pages, e.g., a first page, a second page and a third page.

The first page may correspond to the least significant bit (LSB) page, the second page may correspond to the most significant bit (MSB) page, and the third page may correspond to a center significant bit (CSB) page.

Figure 2:
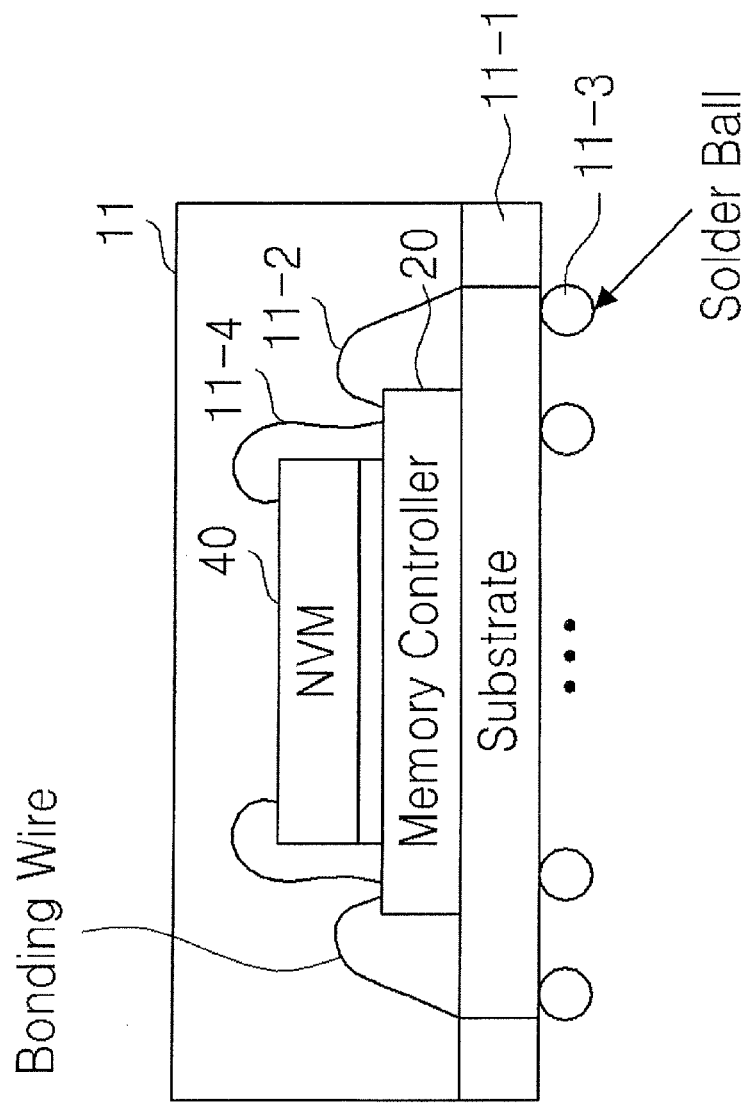
FIG. 2 is an exemplary embodiment of a multi-chip package including the memory system of FIG. 1.

FIG. 2 is an exemplary embodiment of a multi-chip package including the memory system of FIG. 1. Referring to FIG. 2, the multi-chip package 11 includes the memory controller 20 mounted or stacked on a circuit substrate 11-1, e.g., a printed circuit board (PCB), and the non-volatile memory device 40 mounted or stacked on the memory controller 20. The memory controller 20 may communicate with an external device through bonding wires 11-2 and solder balls 11-3. Additionally, the memory controller 20 and the non-volatile memory device 40 may communicate through bonding wires 11-4.

For convenience of explanation in FIG. 2, it is illustrated that the non-volatile memory device 40 is formed on the memory controller 20; however, the relative location of two devices 20 and 30 may be changed according to alternative embodiments. In addition, the memory controller 20 and the non-volatile memory device 40 may communicate with each other through a connection system other than the bonding wires 11-4, and the memory controller 20 and the solder balls 11-3 may be connected to each other through a connection system other than the bonding wires 11-2. The connection system may be implemented as a vertical electrical connection system, e.g., through silicon via (TSV).

Figure 3:
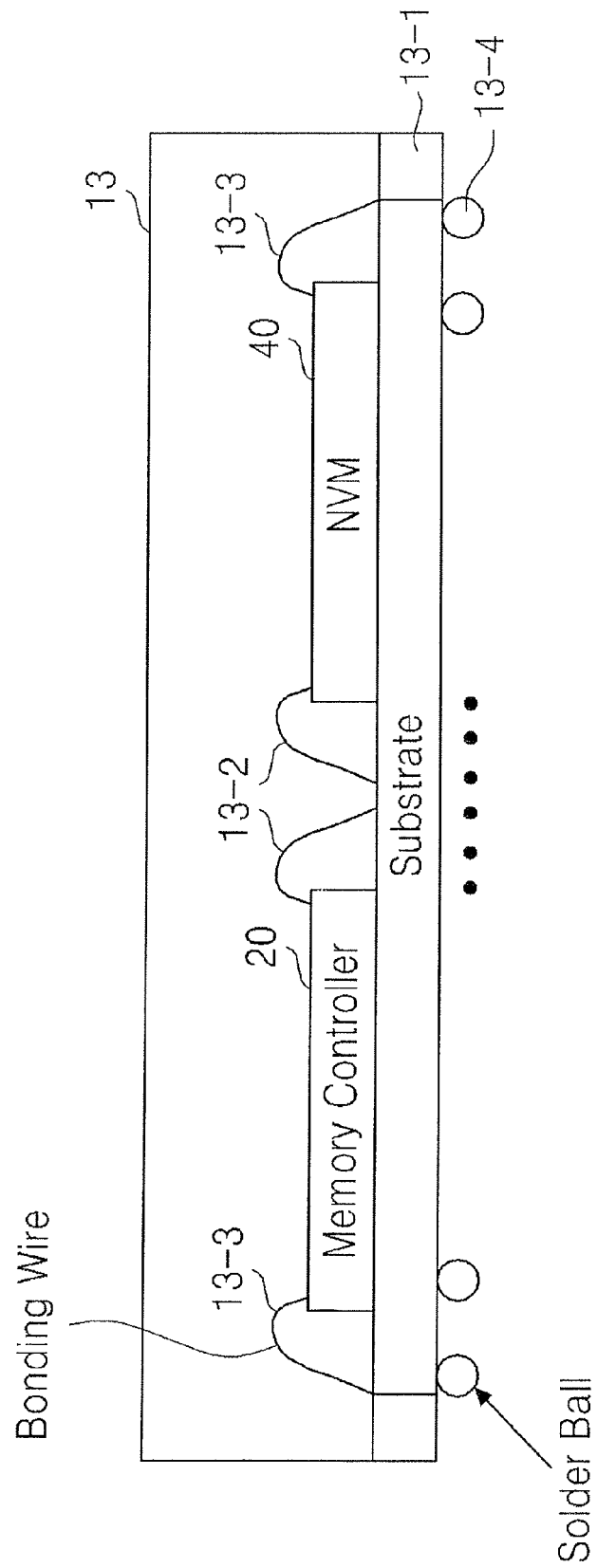
FIG. 3 is another exemplary embodiment of the multi-chip package including the memory system of FIG. 1.

FIG. 3 is another exemplary embodiment of a multi-chip package including the memory system of FIG. 1. Referring to FIG. 3, the multi-chip package 13 includes the memory controller 20 and the non-volatile memory device 40 connected on a circuit substrate 13-1, e.g., a PCB. The memory controller 20 and the non-volatile memory device 40 may communicate with each other through bonding wires 13-2, and each of the memory controller 20 and the non-volatile memory device 40 may communicate with an external device through bonding wires 13-3 and solder balls 13-4.

According to an exemplary embodiment, the memory controller 20 and the non-volatile memory device 40 may communicate with each other through a connection system other than the bonding wires 13-2. The connection system may be implemented as a vertical electrical connection system, e.g., through silicon via (TSV). For example, when each of the memory controller 20 and the non-volatile memory device 40 is connected to the circuit substrate 13-1 through vertical electrical connections, the memory controller 20 and the non-volatile memory device 40 may communicate with each other through the vertical electrical connections and the circuit substrate 13-1.

The memory controller 20 and the non-volatile memory device 40 embodied in each chip may be embodied in a package such as a Package On Package (PoP), Ball Grid Arrays (BGAs), Chip Scale Packages (CSPs), a Plastic Leaded Chip Carrier (PLCC), a Plastic Dual In-Line Package (PDIP), Chip On Board (COB), a CERamic Dual In-Line Package (CERDIP), a plastic metric quad flat pack (MQFP), a Thin Quad Flat Pack (TQFP), a small outline integrated circuit (SOIC), a shrink small outline package (SSOP), a thin small outline (TSOP), a system in package (SIP), a multi chip package (MCP), a wafer-level fabricated package (WFP) or a wafer-level processed stack package (WSP).

Figure 4:
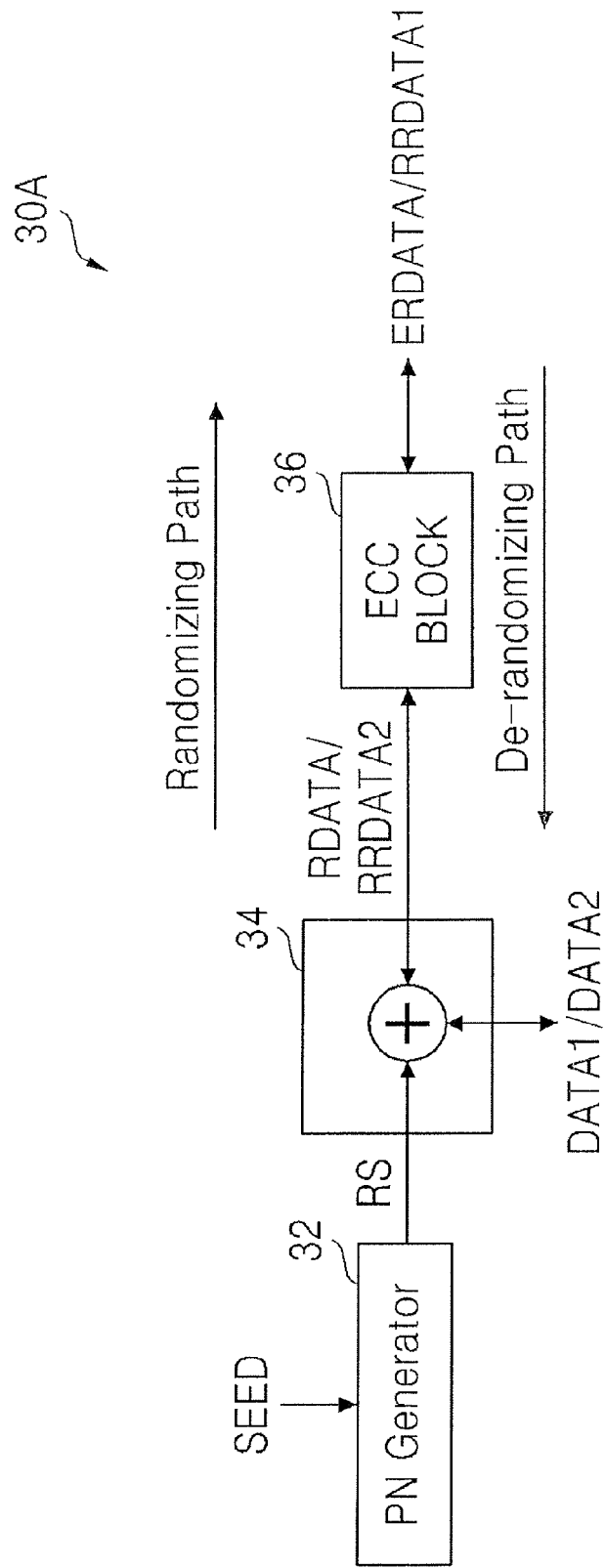
FIG. 4 is a block diagram of an exemplary implementation of the memory interface shown in FIG. 1.

FIG. 4 is a block diagram of an exemplary implementation 30A of the memory interface 30 shown in FIG. 1. Referring to FIG. 4, a memory interface 30A is an exemplary implementation of the memory interface 30 illustrated in FIG. 1 may be used as a data conversion device.

The data conversion device 30A may be used as a randomizer or as a de-randomizer according to the current data path direction. The data conversion device 30A includes a pseudo random number generator 32 and a modulo operator 34.

The pseudo random generator 32 generates a pseudo random number or pseudo random number sequence (RS) by using a seed SEED obtained from a seed table assigned to the current page or a seed SEED included in a zone assigned to a current page. According to an exemplary embodiment, the pseudo random number generator 32 may be implemented as a linear feedback shift register (LFSR), and the LFSR determines its feedback polynomial based on the seed SEED. Accordingly, a pseudo random number RS is determined according to the feedback polynomial. The LFSR may be implemented as a Fibonacci LFSR or Galois LFSR.

According to components included in the pseudo random number generator 32, the pseudo random number generator 32 may generate a linear pseudo random number RS or a non-linear pseudo random number RS.

The modulo operator 34 generates randomized data RDATA by performing a modulo operation on a pseudo random number RS and data DATA1 which will be programmed into a page of nonvolatile memory to be currently programmed.

When randomizing data DATA1 by using the pseudo random number RS, the modulo operator 34 generates randomized data RDATA2 by performing modulo addition on the pseudo random number RS and the data DATA1.

When de-randomizing randomized data RRDATA2 by using the pseudo random number RS, the modulo operator 34 generates data DATA2 by performing modulo subtraction of the pseudo random number RS from the randomized data RRDATA2. Since a modulo-2 addition result is equal to a modulo-2 subtraction result, when the pseudo random number RS is a binary sequence, the modulo operator 34 may be implemented as one or more an exclusive-OR (XOR) gates.

The data conversion device 30A may further include an error correction code (ECC) block 36. During a program operation, the ECC block 36 adds ECC parity bits to the randomized data RDATA and generates randomized data ERDATA including the ECC parity bits. In addition, during a read operation, the ECC block 36 receives randomized data RRDATA1 and ECC parity bits, corrects at least one error (bit) included in the randomized data RRDATA1 by using the ECC parity bits, and outputs error-corrected (or error-free) randomized RRDATA2 to the modulo operator 34.

The modulo operator 34 generates data DATA2 by performing modulo subtraction of a pseudo random number RS from the error-corrected randomized data RRDATA2.

Figure 5:
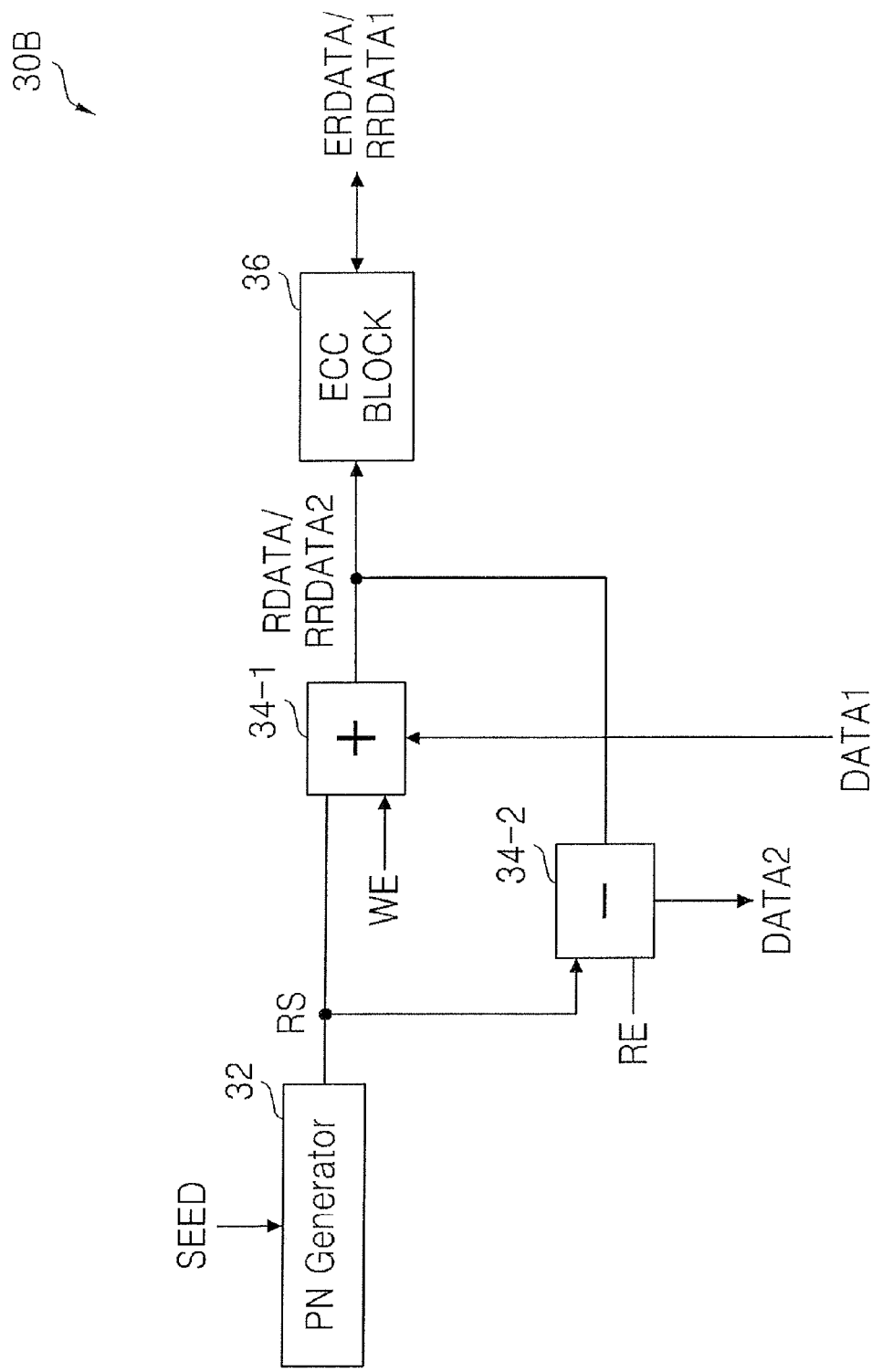
FIG. 5 is a block diagram of another exemplary implementation of the memory interface shown in FIG. 1.

FIG. 5 is a block diagram of another exemplary implementation 30B of the memory interface 30 shown in FIG. 1. Referring to FIG. 5, a memory interface 30B embodied as another example of the memory interface 30 shown in FIG. 1 may be used as a data conversion device. A first modulo operator 34-1 and a second modulo operator 34-2 share a single pseudo random number generator 32.

During a program operation, the first modulo operator 34-1 enabled according to a program enable (write enable) signal WE having a first level, e.g., a high level, randomizes data DATA1 into randomized data RDATA by using a pseudo random number RS. During a read operation, the second modulo operator 34-2 enabled according to a read enable signal RE having a first level de-randomizes randomized data RRDATA2 to data DATA2 by using a pseudo random number RS.

If the time point when a program enable signal WE is changed from a second level, e.g., a low level, to a first level, and the time point where the read enable signal RE is changed from the second level to a first level are adjusted properly, the program operation and the read operation may be performed at different times or at the same time.

The first modulo operator 34-1 performs modulo addition and the second modulo operator 34-2 performs modulo subtraction. According to an exemplary embodiment, when a pseudo random number RS is a binary sequence, each modulo operator 34-1 or 34-3 may be implemented as an exclusive-OR (XOR) gate. The data conversion device 30B may further include an ECC block 36.

FIG. 6 is a graphic showing exemplary embodiments of seed tables assigned per page. For convenience of explanation. in FIG. 6 four seed tables ST1 to ST4 each assigned to one of four pages are illustrated and each of the four seed tables ST1 to ST4 includes a plurality k of entries ENTRY11 to ENTRY1*m*, ENTRY2l to ENTRY2*l*, ENTRY31 to ENTRY3*k*, and ENTRY4*l* to ENTRY4*p*. Herein, m, l, k and p are natural numbers.

Each of the plurality of entries ENTRY1*l* to ENTRY1*m*, ENTRY2*l* to ENTRY2*l*, ENTRY31 to ENTRY3*k*, and ENTRY41 to ENTRY4*p* includes one seed value (called 'seed') to be used in the pseudo random number generator 32 illustrated in FIG. 4 or 5.

For convenience of explanation in FIG. 6, it is illustrated that each entry pointer (ENTRY_PNT1 to ENTRY_PNT4) designates a first entry (ENTRY11, ENTRY 21, ENTRY31 and ENTRY41) of a seed table (ST1 to ST4) as default. However, each entry pointer ENTRY_PNT1 to ENTRY_PNT4 may be set so that it may designate any one of the plurality of entries in its seed table, under the control of the micro-processor 22 of FIG. 1.

For example, when a request to program first data received from a host is input, the micro-processor 22 generates a first address, (e.g., a first page address and/or a first wordline address) corresponding to a first page 42-1. And the micro-processor 22 selects a first seed table ST1 among the plurality of seed tables ST1 to ST4 by using at least one bit of the generated first address.

The micro-processor 22 selects an entry ENTRY11, which a current entry pointer ENTRY_PNT1 designates among a plurality of entries ENTRY11 to ENTRY1*m* included in a first seed table ST1, as the selected seed for programming the first data, and increments the entry pointer ENTRY_PNT1 to designate the next selected entry ENTRY12.

When a request to program second data, third data or fourth data is input from the host, the micro-processor 22 selects each entry ENTRY21, ENTRY31 or ENTRY41, which each current entry pointer ENTRY_PNT2, ENTRY_PNT3 or ENTRY_PNT4 designates on each seed table ST2, ST3 or ST4, as each selected seed for programming the first data, the second data or the third data, and increments each current entry pointer ENTRY_PNT2, ENTRY_PNT3 or ENTRY_PNT4 in the same manner as above described.

When the memory controller 20 is reset, each entry pointer incremented according to a program operation as above described is reset to each default value (e.g., ENTRY 11, ENTRY21, ENTRY31 and ENTRY41).

For example, when there are four seed tables ST1 to ST4: one of the plurality m of entries ENTRY11 to ENTRY1$m$ included in the first seed table ST1 may be selected as the seed for programming page data in the plurality of memory cells connected to an $i^{th}$ (i is a natural number) wordline; one of the plurality of entries ENTRY21 to ENTRY2$l$ included in a second seed table ST2 may be selected as the seed for programming page data in a plurality of memory cells connected to a $(i+1)^{th}$ wordline; one of a plurality of entries ENTRY31 to ENTRY3$k$ included in the third seed table ST3 may be selected as the seed for programming page data into the plurality of memory cells connected to a $(i+2)^{th}$ wordline; and one of a plurality of entries ENTRY41 to ENTRY4$p$ included in a fourth seed table ST4 may be selected as the seed for programming page data in a plurality of memory cells connected to a $(i+3)^{th}$ wordline.

For example, a first entry ENTRY11 may be selected among a plurality of entries ENTRY11 to ENTRY1$m$ included in a first seed table ST1 as the seed for programming page data in a plurality of memory cells connected to a first wordline; and a second entry ENTRY12 may be selected among the plurality of entries ENTRY11 to ENTRY1$m$ included in the first seed table ST1 as the seed for programming page data in a plurality of memory cells connected to a fifth wordline.

FIG. 7 is a graphic illustrating another exemplary embodiment of the seed tables assigned by page.

As illustrated in FIG. 7, when each of a plurality of three-bit MLCs connected to one wordline affects each other, a different seed table ST11, ST12 or ST13 may be used per page. Each of the plurality of seed tables ST11 to ST13 may be selected by using at least one bit of a page address.

For example, when LSB data are to be programmed in a LSB page, the micro-processor 22 selects an entry (e.g., ENTRYL01) currently designated by the entry pointer ENTRY_PNTL among a plurality of entries ENTRYL01, ENTRYL02, ENTRYL03, . . . included in a LSB seed table ST11, and afterwards increments the entry pointer ENTRY_PNTL.

When CSB data are to be programmed in a CSB page, the micro-processor 22 selects an entry (e.g., ENTRYC01) currently designated by the entry pointer ENTRY_PNTC among a plurality of entries ENTRYC01, ENTRYC02, ENTRYC03, . . . included in a CSB seed table ST12, and afterwards increments the entry pointer ENTRY_PNTC.

When MSB data are to be programmed in an MSB page, the micro-processor 22 selects an entry (e.g., ENTRYM01) currently designated by a the entry pointer ENTRY_PNTM among a plurality of entries ENTRYM01, ENTRYM02, ENTRYM03, . . . included in an MSB seed table ST 13 and afterwards increments the entry pointer ENTRY_PNTM.

How and/or how much to increase each entry pointer ENTRY_PNTL, ENTRY_PNTC and ENTRY_PNTM may be controlled or determined by the micro-processor 22, or predetermined.

When the memory controller 20 is reset, each entry pointer ENTRY_PNTL, ENTRY_PNTC and ENTRY_PNTM that has been incremented according to a past program operations is rest to each default value (e.g., ENTRYL01, ENTRYC01 and ENTRYM01).

FIG. 8 is a seed table including a plurality of (sixteen) zones assigned to a plurality of (sixteen) pages, and FIG. 9 illustrates one of the zones ZONE0 illustrated in FIG. 8 including a plurality of entries. Referring to FIGS. 8 and 9, a seed table ST 21 includes a plurality of (e.g. sixteen) zones ZONE0 to ZONE15 and each of the plurality of zones ZONE0 to ZONE15 includes a plurality of entries. For convenience of explanation in FIGS. 8 and 9, a seed table ST21 including sixteen zones ZONE0 to ZONE15 is illustrated; however, sixteen is only an exemplification. Each of the sixteen zones ZONE0 to ZONE15 is selected according to four lower bits PADD[3:0] of a page address PADD, and one of a plurality of (e.g., five) entries included in each of the 16 zones ZONE0 to ZONE15 is currently designated by an entry pointer.

For example, a first zone ZONE0 including five entries ENTRY_Z11 to ENTRY_Z15 is selected according to lower bits (PADD[3:0]=0000) of a page address, and an entry ENTRY_Z11 is selected according to an entry pointer ENTRY_PNTZ0. After an entry ENTRY_Z11 is selected, the entry pointer ENTRY_PNTZ0 is incremented to designate the next entry ENTRY_Z12.

Thus, after an entry is selected according to a program operation, an entry pointer ENTRY_PNTZ0 is incremented to designate the next entry. Whenever the memory controller 20 is reset, the entry pointer ENTRY_PNTZ0 is re-initialized to a default value, e.g., ENTRY_Z11.

As described above, a seed table ST 21 is stored in a memory cell array 140 of the non-volatile memory device 40 or stored in a ROM 26 of the memory controller 20, and may be loaded into the buffer 24 under the control of the micro-processor 22 or referred to by the micro-processor 22.

Figure 10:
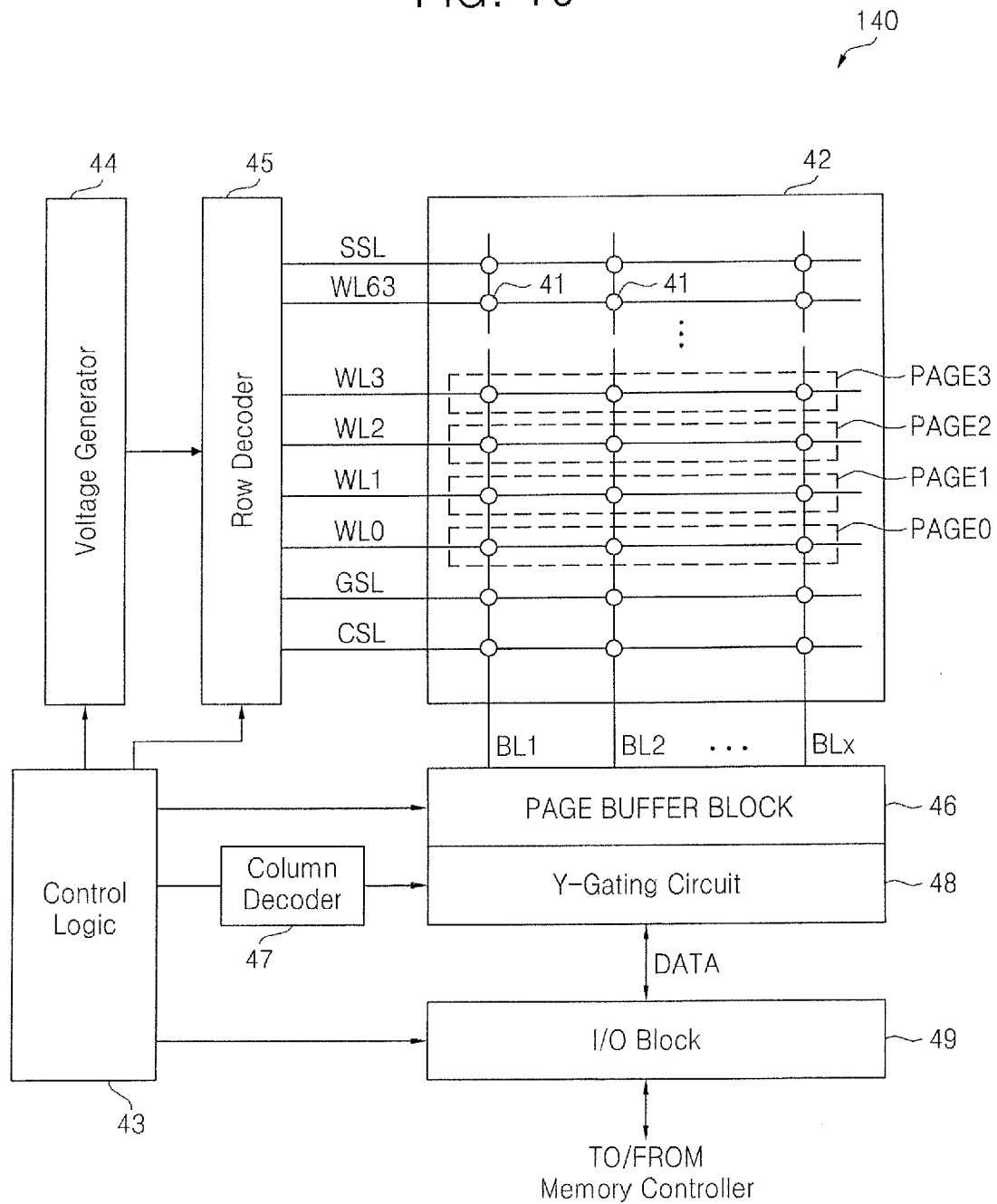
FIG. 10 is a block diagram of an exemplary implementation of the non-volatile memory device 40 which is shown in FIG. 1 and has a memory cell array having a two-dimensional structure.

FIG. 10 is a block diagram of an exemplary implementation 140-2 of the memory cell array 140 in the non-volatile memory device 40 which is shown in FIG. 1 and has a two-dimensional structure. Referring to FIGS. 1 and 10, the non-volatile memory device 40, e.g., a NAND flash memory device, includes the memory cell array 140 (e.g., 140-2) for storing data, a control logic 43, a voltage generator 44, a low decoder 45, a page buffer block 46, a column decoder 47, a Y-gating circuit 48 and an input/output block 49.

The memory cell array 140-2 includes a plurality of NAND memory cell strings. Each of the plurality of NAND memory cell strings includes a plurality of NAND memory cells 41 connected in series.

For example, a first NAND memory cell string includes a plurality of NAND memory cells 41 connected in series between a bit line BL1 and a common source line (CSL). The plurality of NAND memory cells 41$a$ includes a first selection transistor (or a string selection transistor) connected to a bit line BL1 and a second selection transistor (or a ground selection transistor) connected to the common source line (CSL).

The gate of each first selection transistor is connected to a string selection line (SSL). Each gate of the plurality of NAND memory cells 41 is connected to one of a plurality M of wordlines WL0 to WL63 (e.g., where M equals 64). And the gate of the second selection transistor is connected to a ground selection line (GSL).

As described above, when each of memory cells is a SLC, each wordline, e.g., WL0 to WL63, defines one page (e.g., among pages PAGE0, PAGE1, PAGE2, PAGE3, or PAGE4 to PAGE63).

The memory cell array 140 including M (e.g., M equals 64) wordlines WL0 to WL63 is illustrated in FIG. 10; however, it is not restricted to the number M of wordlines being equal to 64.

Figure 11:
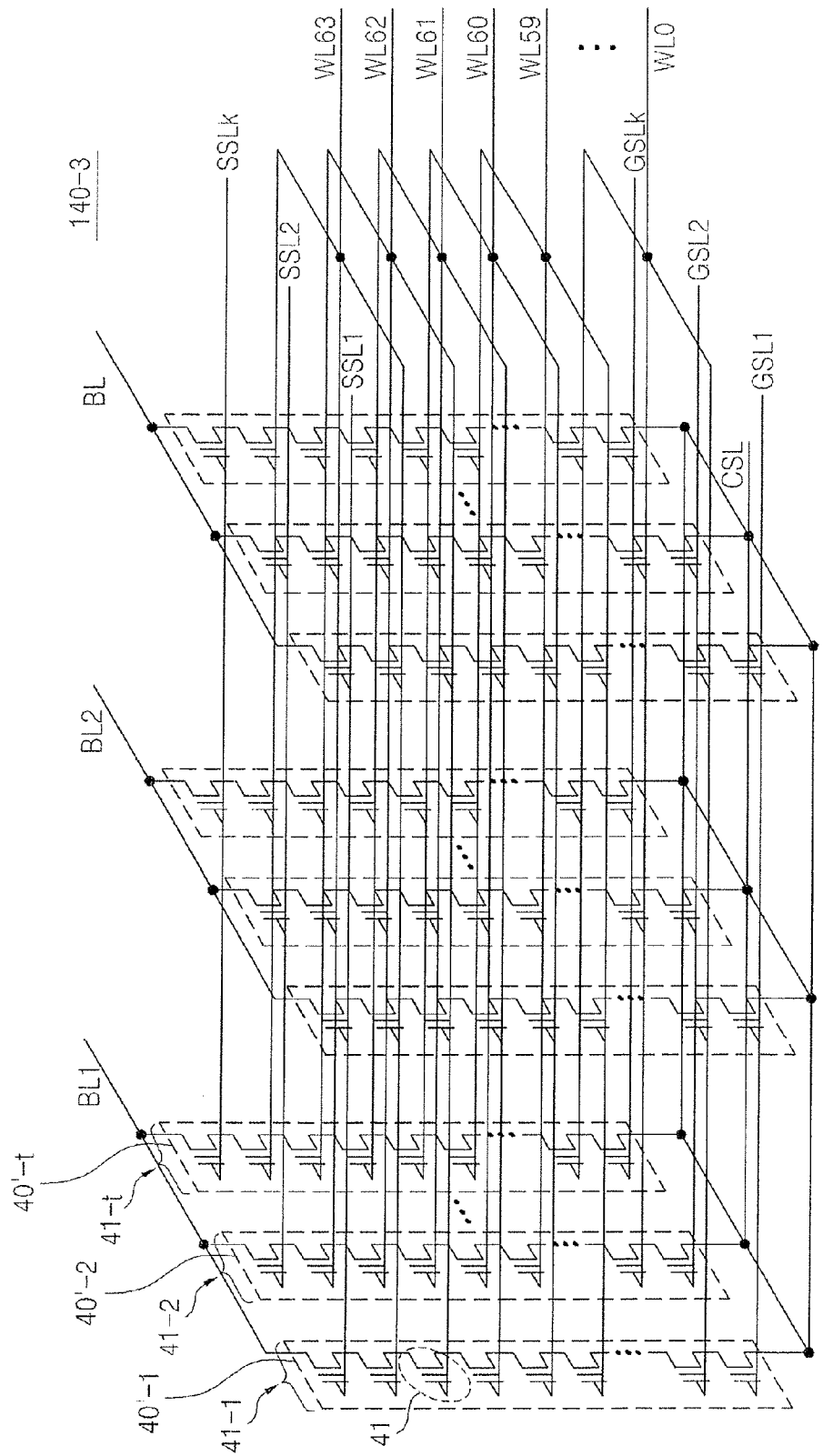
FIG. 11 is a block diagram of a n alternative implementation of the memory cell array of the non-volatile memory device shown in FIG. 1 that has a three-dimensional structure.

FIG. 11 is a block diagram of an alternative implementation of the memory cell array of the non-volatile memory device shown in FIG. 1 that has a three-dimensional structure. As illustrated in FIG. 11, each NAND memory cell string 40'-1, 40'-2, ..., 40'-t (where t is a natural number) may be arranged on a different one of t three-dimensionally different planes.

As illustrated in FIG. 11, a first NAND memory cell string 40'-1 may be arranged on a first layer 41-1, a second NAND memory cell string 40'-2 may be arranged on a second layer 41-2 different from the first layer 41-1, and a $t^{th}$ NAND memory cell string 40'-t may be three-dimensionally arranged on a t-th layer 41-t different from the second layer 41-2.

A plurality t of layers 41-1 to 41-t may be formed through a wafer stack, a chip stack or a cell stack. The plurality t of layers 41-1 to 41-t may be connected through an electrical vertical connection such as a though-silicon via (TSV), a bump or wire bonding. Each of the plurality t of layers 41-1 to 41-t includes a plurality of cell strings.

As illustrated in FIG. 11, each NAND memory cell string 40'-1, 40'-2, ..., 40'-t may share a plurality of wordlines WL0 to WL63, CSL and one bit line BL1.

The "memory cell array" of the present inventive concept generally may be implemented as the two-dimensional memory cell array 140-2 illustrated in FIG. 10 and/or as the three-dimensional memory cell array 140-3 illustrated in FIG. 11.

The control logic 43 which may be implemented as a circuit, logic, a code or a combination thereof controls the data access operations, (e.g., a program operation, a read operation and/or an erase operation), of the NAND flash memory device 40. For example, the control logic 43 controls an operation of each component 44, 46, 47, 48 and 49 to perform the data access operations according to a plurality of control signals output from the memory controller 20.

The voltage generator 44 generates a plurality of voltages including a program voltage necessary for performing a program operation, a plurality of voltages including a read voltage necessary for performing a read operation, and a plurality of voltages including an erase voltage necessary for performing an erase operation. The voltage generator 44 may output a plurality of voltages necessary for each operation to the row decoder 45.

The row decoder 45 supplies a plurality of voltages output from the voltage generator 44 to a selected plurality of wordlines WL0 to WL63 according to a row address output from the control logic 43. Under the control of the control logic 43, the column decoder 47 decodes a column address and outputs a plurality of selection signals to the Y-gating circuit 48.

The page buffer block 46 includes a plurality of page buffers. Each of the plurality of page buffers is connected to one of a plurality of bit lines BL1 to BLx, where x is a natural number.

Each of the plurality of page buffers may operate as a driver for programming data into the memory cell array during a program operation under the control of the control logic 43. In addition, each of the plurality of page buffers may operate as a sense amplifier which may sense-amplify a voltage level on each of the plurality of bit lines BL1 to BLx during a read operation or a verify operation under the control of the control logic 43.

The Y-gating circuit 48 controls transmission of data between the page buffer block 46 and an input/output block 49 in response to a plurality of selection signals output from a column decoder 47.

The input/output block 49 transmit data input from the memory controller 20 to the Y-gating circuit 48 or transmits data output from the Y-gating circuit 48 to the memory controller 20 through a plurality of input/output pins or a data bus.

Figure 12A:
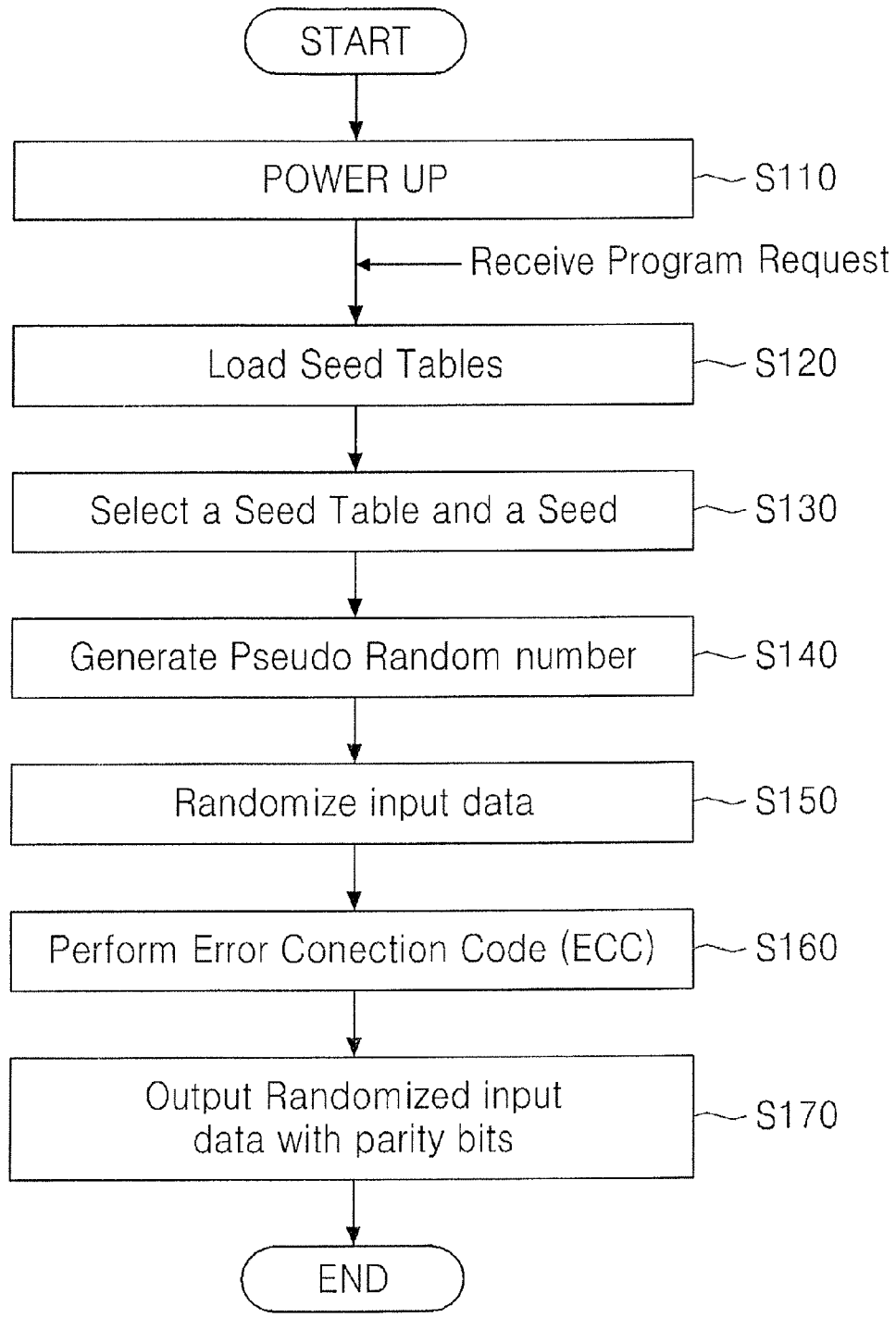
FIG. 12A is a flowchart for explaining an operation of the memory system illustrated in FIG. 1 using seed tables assigned by page.
Figure 12B:
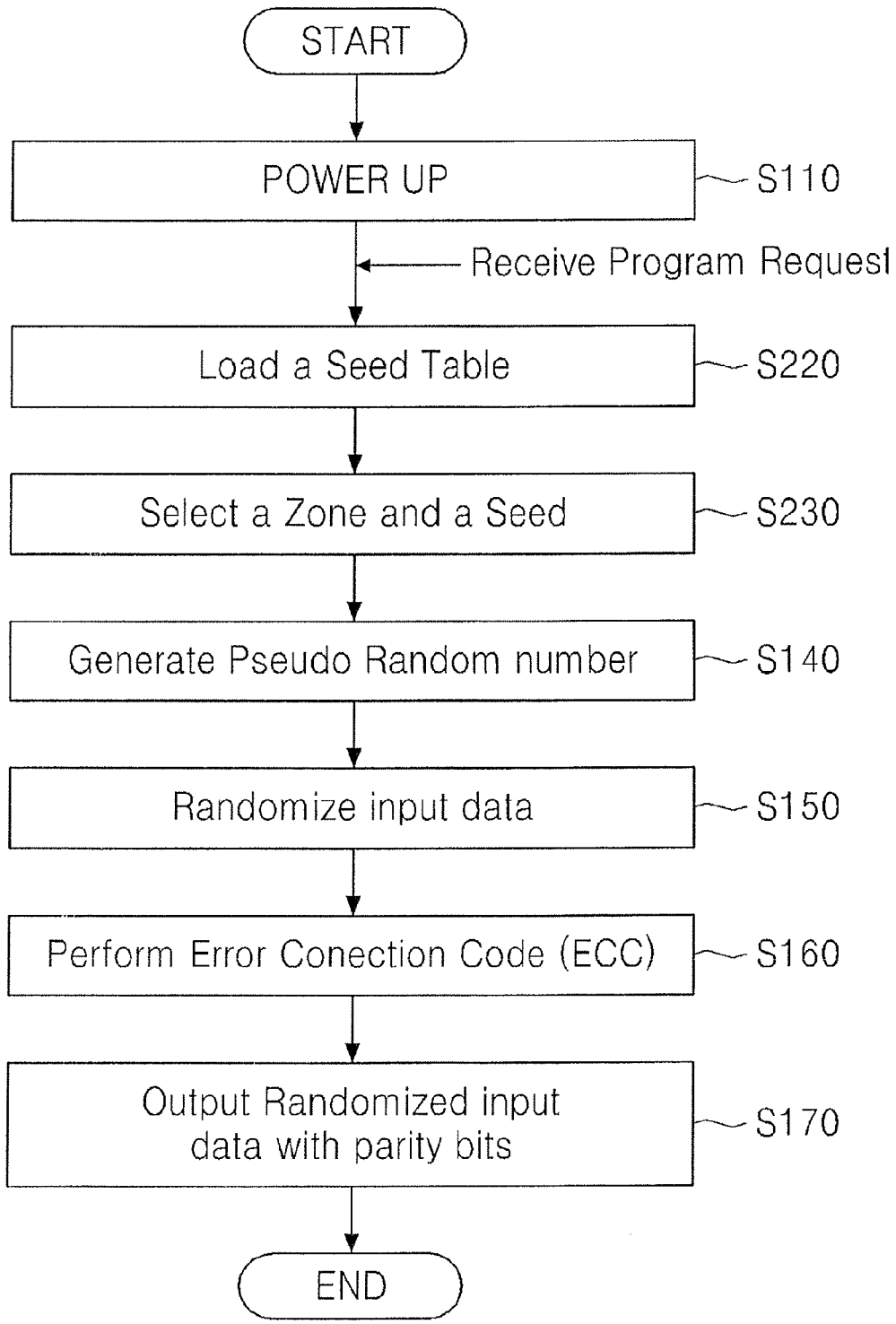
FIG. 12B is a flowchart for explaining an operation of the memory system illustrated in FIG. 1 using a plurality of zones included in a seed table.

FIG. 12A is a flowchart for explaining steps of an operation of the memory system illustrated in FIG. 1 using seed tables assigned by page, and FIG. 12B is a flowchart for explaining steps of an operation of the memory system illustrated in FIG. 1 using a plurality of zones included in one seed table.

Referring to FIGS. 1 to 12B, an operation of the memory controller 20 selecting a seed, which is included in a seed group among a plurality of seed groups for a page to be currently programmed, is explained as follows.

As illustrated in FIGS. 6 and 7, each of the plurality of seed groups may be stored in different seed tables ST1 to ST4 or ST11 to ST13, and may be stored in a seed table ST21 as illustrated in FIG. 8.

The memory controller 20 is powered up (S110). Here, an entry pointer ENTRY_PNT1, ENTRY_PNT2, ENTRY_PNT3, ENTRY_PNT4, ENTRY_PNTL, ENTRY_PNTC, ENTRY_PNTM or ENTRY_PNTZ0 increasing according to a previous program operation is initialized to a default value ENTRY11, ENTRY21, ENTRY31, ENTRY41, ENTRYL01, ENTRYC01, ENTRYM01 or ENTRY_Z11.

The memory controller 20 receives data and a program request output from a host. According to an exemplary embodiment, a plurality of seed tables ST1 to ST4, ST11 to ST13 may be loaded into the buffer 24 during a power-up operation or loaded in the buffer 24 in real time during a program operation (S120). According to another exemplary embodiment, a single seed table ST21 may be loaded in the buffer 24 during a power-up operation or loaded in the buffer 24 at real time during a program operation (S220).

According to the program request, the micro-processor 22 generates a page address of a page where the data will be stored or a wordline address to program the data in the non-volatile memory device 40.

According to an exemplary embodiment, the micro-processor 22 selects one of a plurality of seed tables ST1 to ST4 by using at least one bit of the page address or at least one bit of the wordline address, selects an entry among a plurality of entries included in a selected seed table, which is designated by an entry pointer, as the seed SEED, and afterwards increases the entry pointer (S130).

According to another exemplary embodiment, the micro-processor 22 selects any one of a plurality of zones ZONE0 to ZONE15 included in a single seed table ST21 by using at least one bit of the page address or at least one bit of the wordline address, selects an entry among a plurality of entries included in a selected zone, which is designated by an entry pointer, as the seed SEED, and afterwards increases the entry pointer (S230).

The pseudo random number generator 32 generates a pseudo random number RS by using the seed selected by the micro-processor 22 (S140). The modulo operator 34 performs modulo addition upon the pseudo random number RS and the input data DATA1 and generates randomized data RDATA as a result. Thus, the modulo operator 34 randomizes input data DATA1 by using a pseudo random number RS (S150).

The ECC block 36 generates parity bits by using randomized data RDATA (S160) and outputs randomized data ERDATA including the parity bits to the non-volatile memory device 40 (S170).

For example, the micro-processor 22 may generate an address necessary for programming data output from the host or self-generated metadata in the non-volatile memory device 40.

Figure 13:
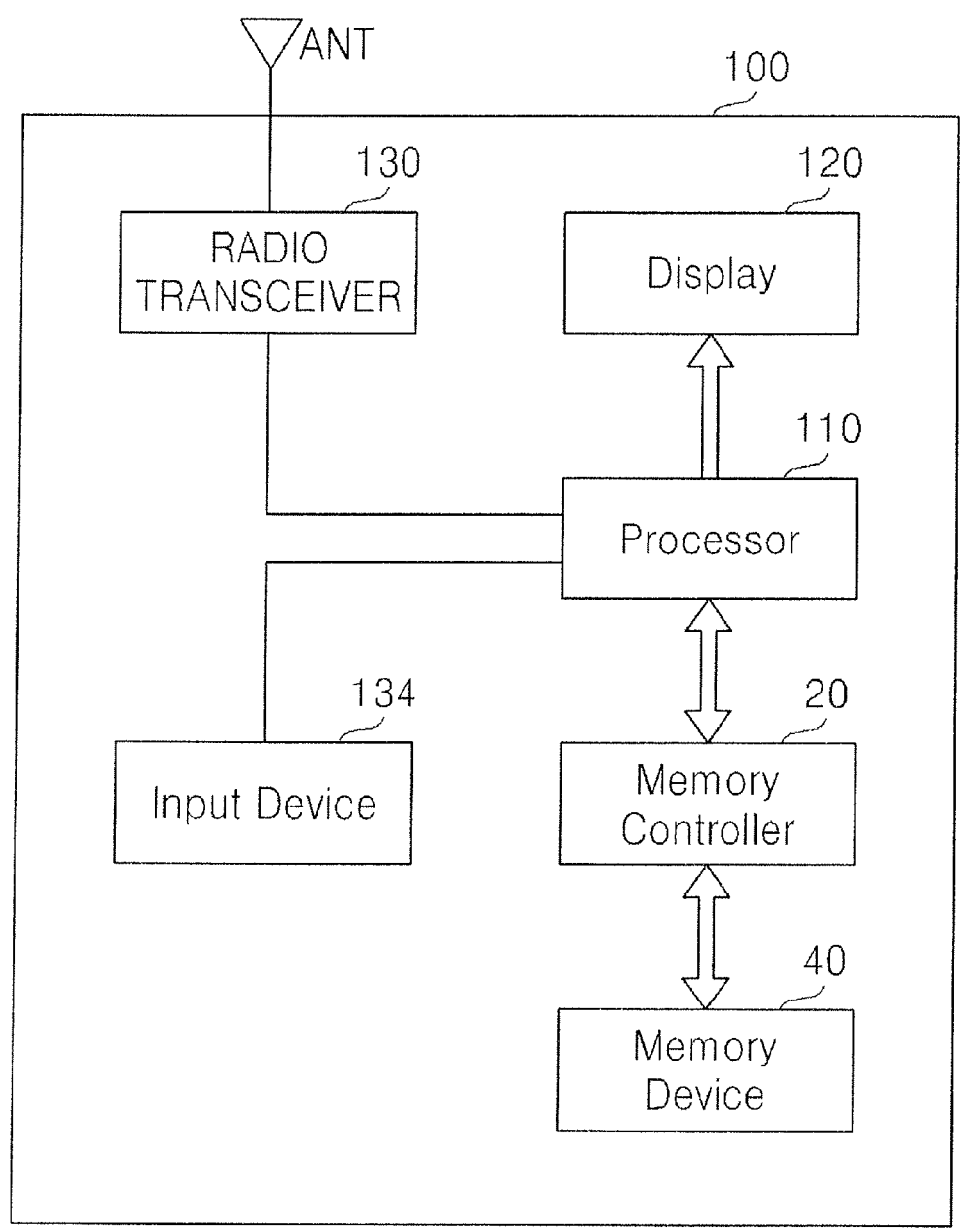
FIG. 13 is a block diagram of exemplary embodiment of an electronic device including the memory system of FIG. 1.

FIG. 13 is a block diagram of an exemplary embodiment of an electronic device including the memory system of FIG. 1. Referring to FIGS. 1, 2, 7 and 13, the electronic device 100 may be implemented as a cellular/mobile phone, a smart phone, a tablet personal computer (PC), a personal digital assistant (PDA), a video game console or a handheld communication device.

The electronic device 100 includes the memory controller 20 and the non-volatile memory device 40. The memory controller 20 controls the data access operation, (e.g., a program operation, an erase operation or a read operation), of the non-volatile memory device 40 according to control of the processor 110.

According to a program request, the memory controller 20 generates a pseudo random number RS by using a seed included in a seed table assigned by page or a seed included in a zone assigned to a page, randomizes data by using a pseudo random number RS and outputs randomized data RDATA. Accordingly, the non-volatile memory device 40 may program randomized data into a page to be currently programmed.

Data programmed into the non-volatile memory device 40 may be displayed through a display 120 according to control of the processor 110 and/or the memory controller 20. The display 120 may be implemented as a flat panel display such as a thin film transistor-liquid crystal display (TFT-LCD), a light-emitting diode (LED) display, an organic LED (OLED) display or an active matrix OLED (AMOLED) display.

A radio transceiver 130 may transmit or receive a radio signals through an antenna ANT. For example, the radio transceiver 130 may change a radio signal received through the antenna ANT into a signal which may be processed by the processor 110. Accordingly, the processor 110 may process a signal output from the radio transceiver 130 and transmit a processed signal to the memory controller 20 or the display 120. The memory controller 20 of the present invention may program (store) a signal processed by the processor 110 in the non-volatile memory device 40.

In addition, the radio transceiver 130 may change a signal output from the processor 110 into a radio signal and output a changed radio signal to an external device through the antenna ANT.

An input device 134 is a device which may input a control signal for controlling an operation of the processor 110 or data to be processed by the processor 110, and it may be implemented as a pointing device such as a touch pad and a computer mouse, a keypad or a keyboard.

The processor 110 may control an operation of the display 120 so that data output from the memory controller 20, data output from the radio transceiver 130 or data output from the input device 134 may be displayed through the display 120.

According to an exemplary embodiment, the memory controller 20 which controls an operation of the non-volatile memory device 40 may be implemented as a part of the processor 110 or as a chip separate from the processor 110.

Figure 14:
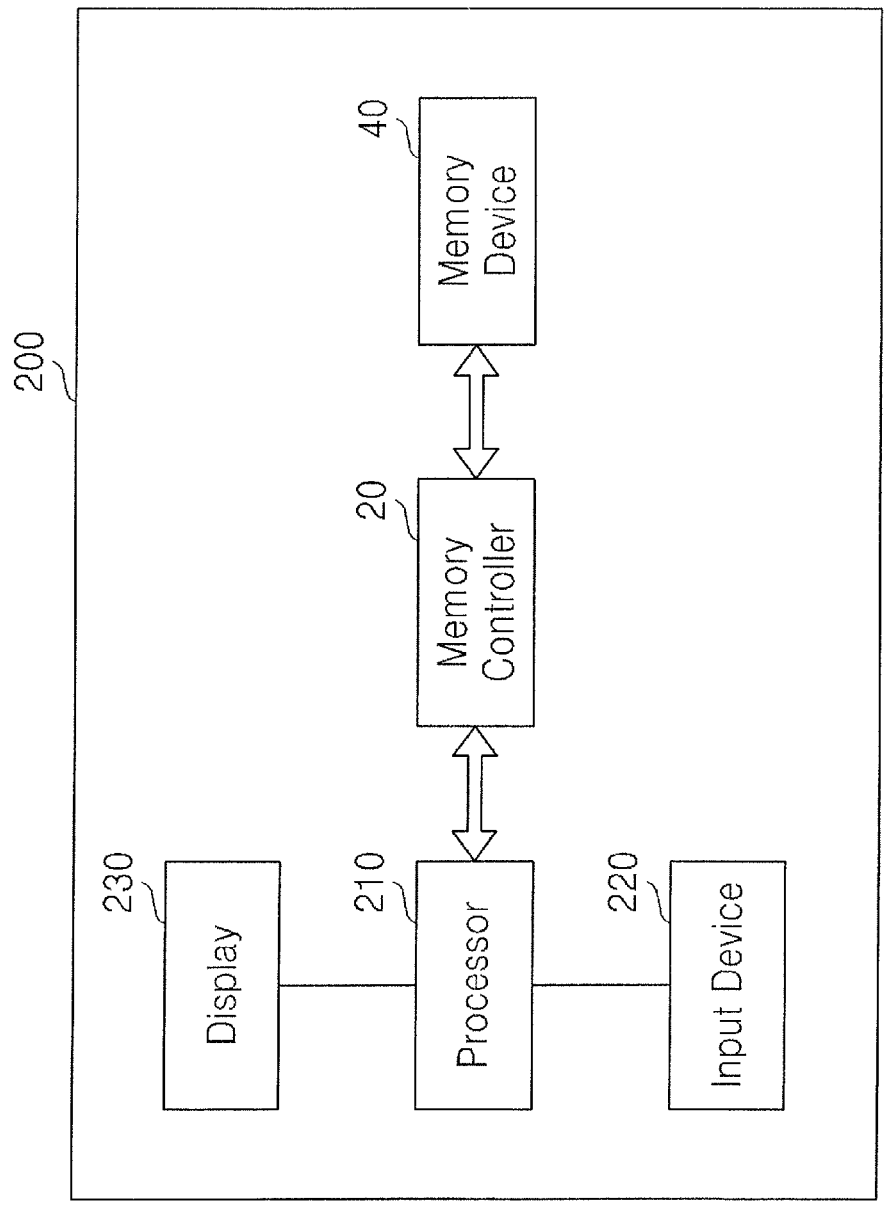
FIG. 14 is a block diagram of another exemplary embodiment of an electronic device including the memory system of FIG. 1.

FIG. 14 is a block diagram of another exemplary embodiment of an electronic device including the memory system illustrated in FIG. 1. The electronic device 200 illustrated in FIG. 14 may be implemented as a personal computer (PC), a laptop computer, a net-book, an e-reader, a portable multimedia player (PMP), a MP3 player or a MP4 player.

The electronic device 200 includes the non-volatile memory device 40 and the memory controller 20 which controls a data access operation of the non-volatile memory device 40.

The processor 210 may display data stored in the non-volatile memory device 10 through a display 230 according to data input through an input device 220. For example, the input device 220 may be implemented as a pointing device such as a touch pad or a computer mouse, a keypad or a keyboard. In addition, the input device 220 may be an interface which may interface data with other devices.

The processor 210 may control the general operation of the electronic device 200 and may control the operation of the memory controller 20.

The memory controller 20 which controls an operation of the non-volatile memory device 40 according to an exemplary embodiment may be implemented as a part of the processor 210 or as a chip separate from the processor 210.

Figure 15:
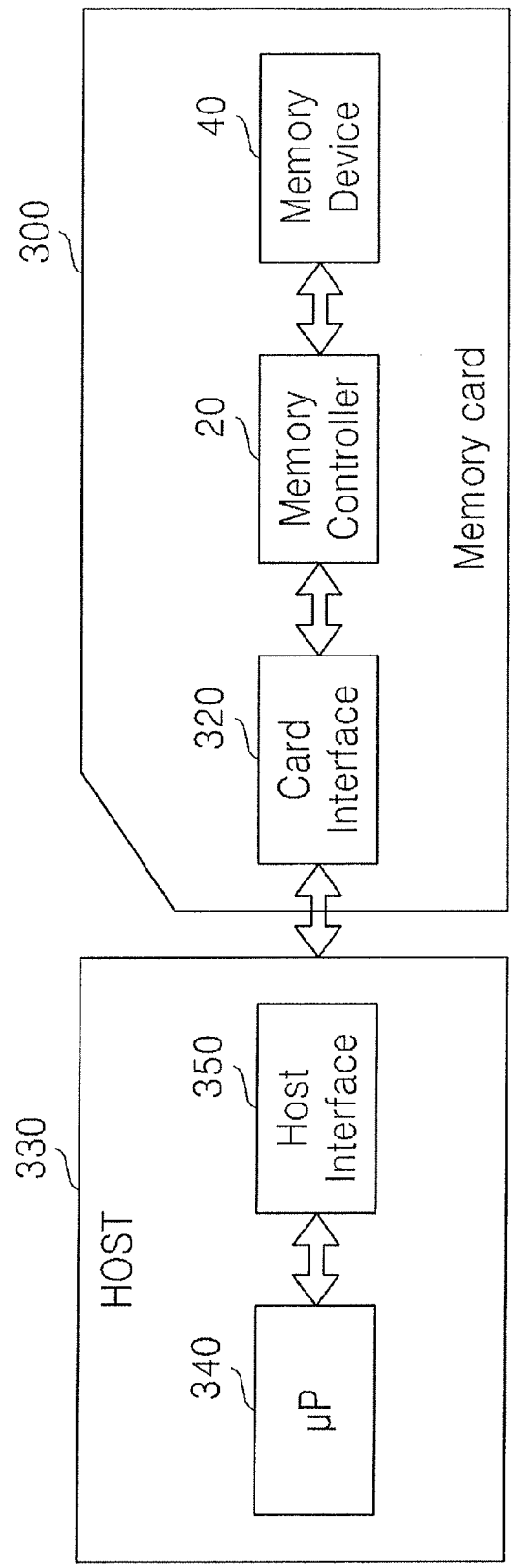
FIG. 15 is a block diagram of still another exemplary embodiment of an electronic device including the memory system of FIG. 1.

FIG. 15 is a block diagram of still another exemplary embodiment of an electronic device including the memory system of FIG. 1. For convenience of explanation in FIG. 15, an electronic device 300 and a host 330 are illustrated together. The electronic device 300 illustrated in FIG. 15 may be implemented as a memory card or a smart card. The memory card, which is an electronic flash memory data storage device used to store the digital information, may be a PC card, a multimedia card (MMC), an embedded MMC (e-MMC), a secure digital (SD) card or a universal serial bus (USB) flash drive.

The electronic device 300 implemented as a memory card includes the memory controller 20, the non-volatile memory device 40, and a card interface 320. The memory controller 20 may control exchange of data between the non-volatile memory device 40 and the card interface 320.

According to an exemplary embodiment, the card interface 320 may be a secure digital (SD) card interface or a multi-media card (MMC) interface; however it is not restricted thereto.

The card interface 320 may interface data exchange between a host 330 and the memory controller 20 according to a common protocol of the host 330 and the card interface 320. The card interface 320 may support a universal serial bus (USB) protocol and an InterChip (IC)-USB protocol according to an exemplary embodiment. Here, a card interface may mean hardware supporting a protocol that the host 330 uses, software embedded in the hardware or a signal transmission mode.

When the electronic device 300 is connected to a host interface 350 of a host 330 such as a PC, a laptop computer, a tablet PC, a digital camera, a digital audio player, a cellular phone, a video game console, a MP3 player, a portable multimedia player (PMP), an e-book or a digital set-top box, the host interface 350 may perform data communication with the non-volatile memory device 40 through a card interface 320 and the memory controller 20 under control of the micro-processor 340.

Figure 16:
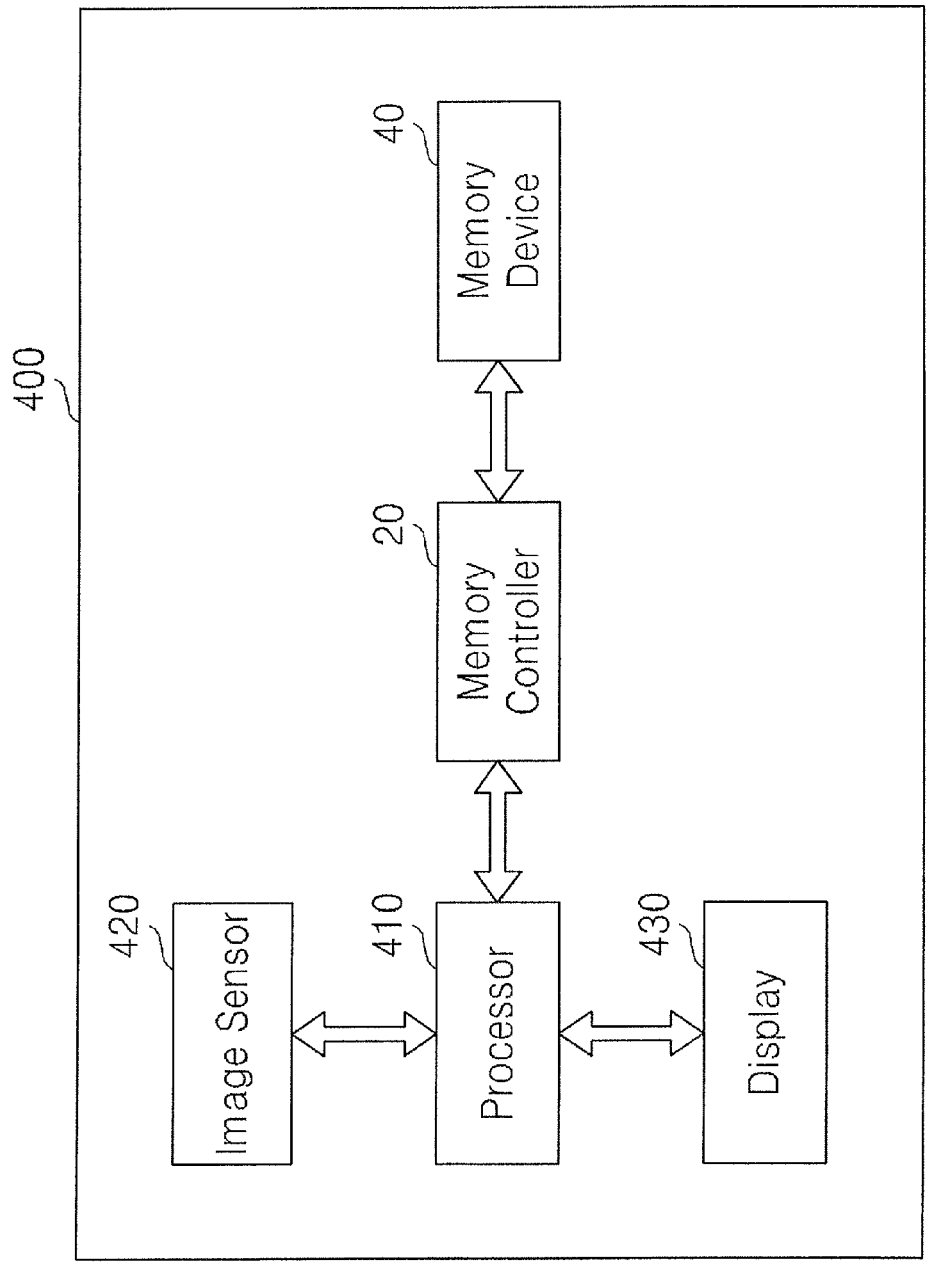
FIG. 16 is a block diagram of still another exemplary embodiment of an electronic device including the memory system of FIG. 1.

FIG. 16 is a block diagram of still another exemplary embodiment of an electronic device including the memory system illustrated in FIG. 1. An electronic device 400 of FIG. 16 may be implemented as an image processing device, e.g., a digital camera, a digital camera-embedded cellular phone, a digital camera-embedded smart phone, a digital camera-embedded laptop PC, or a digital camera-embedded tablet PC.

The electronic device 400 includes the non-volatile memory device 40 and the memory controller 20 which controls a data access operation of the non-volatile memory device 40, e.g., a program operation, an erase operation or a read operation.

An image sensor 420 of the electronic device 400 converts an optical image into digital image signals and converted digital image signals are transmitted to a processor 410 and/or the memory controller 20. Under control of the processor 410, the converted digital image signals may be displayed through a display 430 or stored in the non-volatile memory device 40 through the memory controller 20. In addition, data stored in the memory device 40 are displayed through the display 430 under the control of the processor 410 and/or the memory controller 20.

According to an exemplary embodiment, the memory controller 20 which controls the data access operation of the non-volatile memory device 40 may be implemented as part of the processor 410 or as a chip separate from the processor 410.

Figure 17:
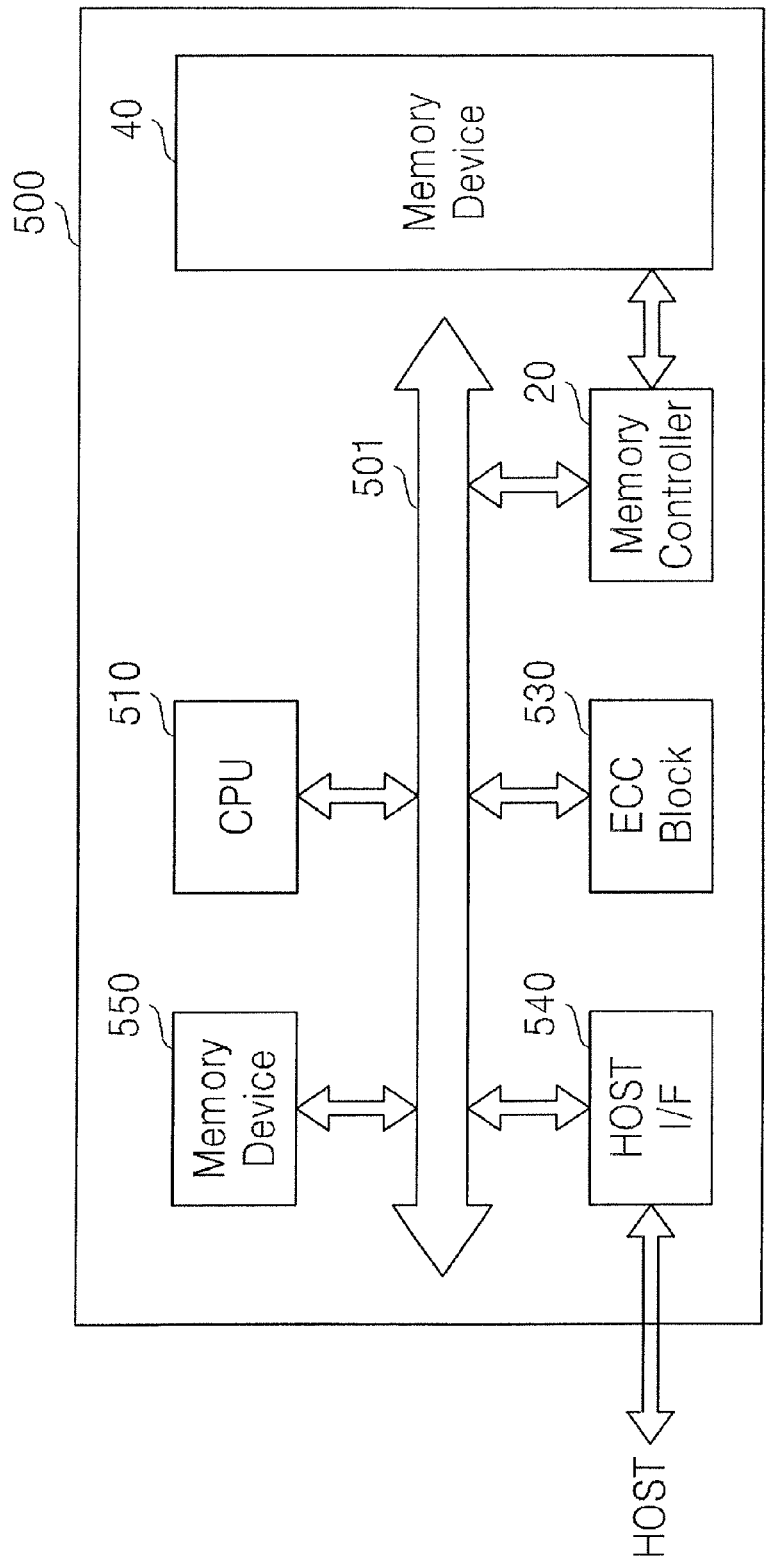
FIG. 17 is a block diagram of still another exemplary embodiment of an electronic device including the memory system of FIG. 1.

FIG. 17 is a block diagram of still another exemplary embodiment of an electronic device including the memory system of FIG. 1. Referring to FIG. 17, an electronic device 500 includes the non-volatile memory device 40 and the memory controller 20 which controls an operation of the non-volatile memory device 40.

The electronic device 500 includes a second memory device 550 which may be used as a system memory of a central processing unit (CPU) 510. The second memory device 550 may be implemented as a non-volatile memory like a read only memory (ROM) or implemented as a volatile memory like a static random access memory (SRAM).

A host connected to the electronic device 500 may perform data communication with the non-volatile memory device 40 through the memory controller 20 and a host interface 540.

According to control of a CPU 510, an ECC block 530 may detect an error bit included in data output from the non-volatile memory device 40 through the memory controller 20, correct the error bit, and transmit error-corrected data to a host through a host interface 540. According to an alternative embodiment, the ECC block 530 may not be included in the electronic device 500. The CPU 510 may control data communication among the memory controller 20, the ECC block 530, the host interface 540 and a memory device 550 through a bus 501.

The electronic device 500 may be implemented as a flash memory drive, a USB memory drive, an IC-USB memory drive or a memory stick.

Figure 18:
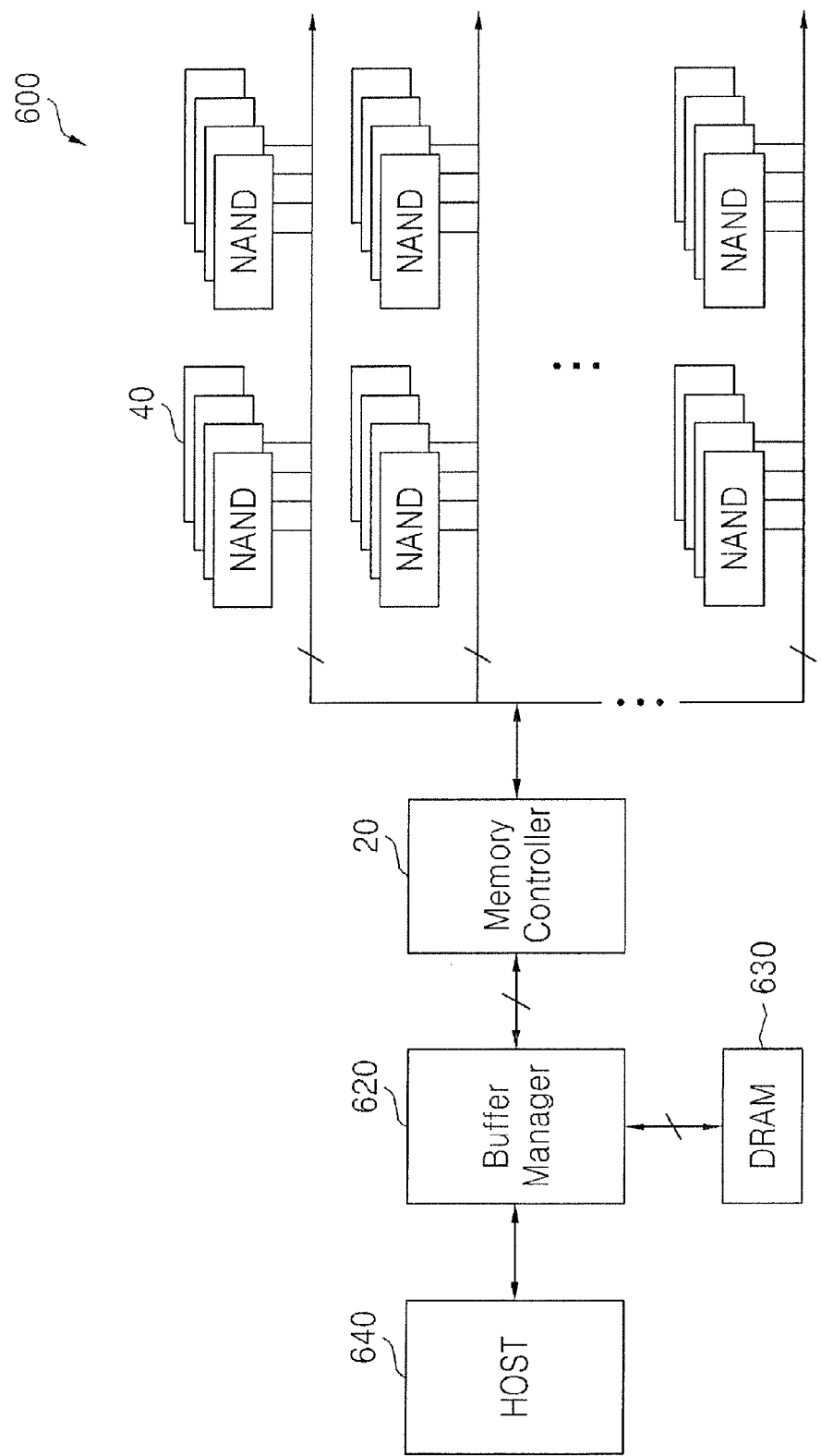
FIG. 18 is a block diagram of still another exemplary embodiment of an electronic device including the memory system of FIG. 1.

FIG. 18 is a block diagram of still another exemplary embodiment of an electronic device including the memory system of FIG. 1. Referring to FIG. 18, an electronic device 600 may be implemented as a data storage device like a solid state drive (SSD).

The electronic device 600 includes a plurality of solid state memory devices 40, the memory controller 20, a volatile memory device 630 and a buffer manager 620.

The memory controller 20 controls a data access operation of each of the plurality of solid state memory devices 40. Each of the plurality of solid state memory devices 40 may be implemented as the non-volatile memory device, e.g., a NAND flash memory device, illustrated in FIGS. 1 and 10 and each includes a plurality of pages. The memory controller 20 may program randomized data into each page in each one of the plurality of solid state memory devices 40.

The volatile memory device 630 may be implemented as a DRAM, and it temporarily stores data transmitted or received between the memory controller 20 and a host 640. The buffer manager 620 may control a data buffering operation of the volatile memory device 630 and/or the memory controller 20.

Figure 19:
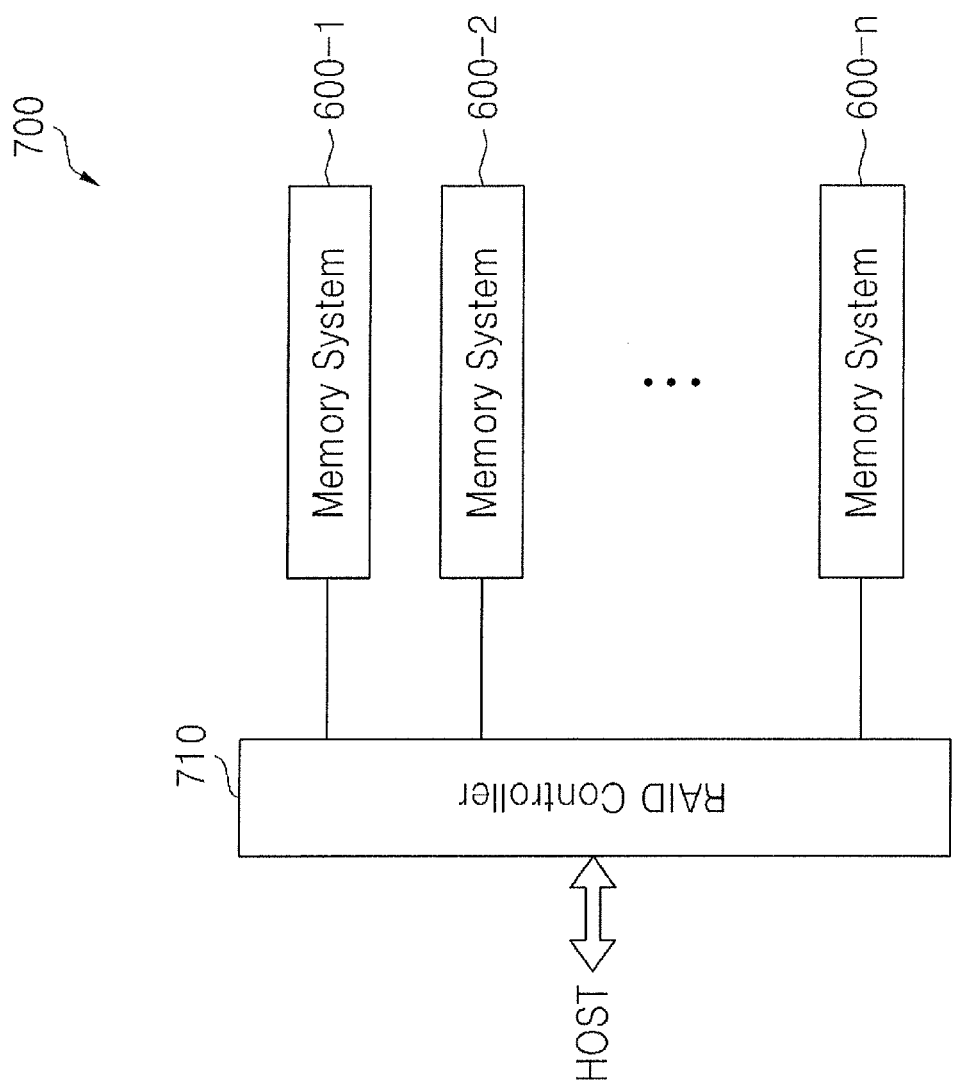
FIG. 19 is a block diagram of a data storage system including the electronic device of FIG. 18.

FIG. 19 is a block diagram of a data storage system including the electronic device 600 of FIG. 18. Referring to FIGS. 18 and 19, a data storage device 700 which may be implemented as a redundant array of independent disks (RAID) system may include a RAID controller 710 and a plurality of electronic devices 600-1 to 600-$n$, where n is a natural number.

Each of the electronic devices 600-1 to 600-$n$ is preferably the electronic device 600 of FIG. 18. The plurality of electronic devices 600-1 to 600-$n$ may compose a RAID array. A data storage device 700 may be included in a PC, network-attached storage (NAS) or a solid state drive (SSD). Each of the electronic devices 600-1 to 600-$n$ may be a memory system embodied in a memory module type.

During a program operation, a RAID controller 710 may output data output from a host to at least one of the plurality of electronic devices 600-1 to 600-$n$ based on a RAID level according to a program request output from the host.

During a read operation, the RAID controller 710 may transmit data, read by at least one of the plurality of electronic devices 600-1 to 600-$n$, to the host according to a read command output from the host.

A memory controller according to an exemplary embodiment of the present inventive concepts and an operation method thereof may prevent a seed correlation between a plurality of pages by randomizing data according to a pseudo random number generated by using a seed included in different seed tables for each page or a seed included in different zones for each page.

Although a various embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:
1. A memory system comprising:
 a non-volatile memory device including a memory cell array having a plurality of pages; and
 a memory controller controlling an access operation of the non-volatile memory device,
 wherein the memory controller comprises:
  a micro-processor configured to:
   select a first seed group corresponding to a first page to be programmed from among a plurality of seed groups based on part of bits of a page address of the first we, where each of the seed groups stores a plurality of seeds,
   select a seed included in the selected seed group; and
  a randomizer configured to generate a pseudo-random number by using the selected seed, to pseudo-randomize data to be programmed in the first page based on the generated pseudo-random number to generate pseudo-randomized data, and to output the pseudo-randomized data to the non-volatile memory device,
 wherein the memory cell array is a three-dimensional memory cell array.

2. The memory system of claim 1, wherein the micro-processor selects, from among a plurality of entries included in the first seed group, an entry designated by an entry pointer as the selected seed, and then increases the entry pointer to a next entry in the first seed group storing a seed different from the selected seed.

3. The memory system of claim 1, when each of the plurality of seed groups is stored in different seed tables.

4. The memory system of claim 1, if the plurality of seed groups are stored in an identical seed table and if each of the plurality of seed groups corresponds to one of a plurality of zones including a plurality of entries, then the micro-processor selects a zone from among the plurality of zones based on the part of the bits, and the micro-processor selects from among a plurality of entries included in the selected zone an entry designated by an entry pointer as the selected seed, and then increases the entry pointer to a next entry in the selected zone.

5. The memory system of claim 1, wherein the memory system is embodied as a multi-chip package including a first chip implementing the non-volatile memory device and a second chip implementing the memory controller.

6. A memory card comprising:
a non-volatile memory device including a memory cell array having a plurality of pages;
a card interface for communicating with a host; and
a memory controller controlling communication between the non-volatile memory device and the card interface,
wherein the memory controller comprises:
a micro-processor configured to:
select a first seed group corresponding to a first page to be programmed from among a plurality of seed groups based on part of bits of a page address of the first page, where each of the seed groups stores a plurality of seeds, and
a select a seed among the plurality of seeds included in the first seed group; and
a randomizer configured to generate a pseudo-random number by using the selected seed, to pseudo-randomize data to be programmed in the first page based on the generated pseudo-random number to generate pseudo-randomized data, and to output the pseudo-randomized data to the non-volatile memory device.

7. The memory card of claim 6, wherein the micro-processor selects, from among a plurality of entries included in the first seed group, an entry designated by an entry pointer as the selected seed, and then increases the entry pointer to a next entry in the first seed group storing a seed different from the selected seed.

8. The memory card of claim 6, wherein the memory card is a multimedia card (MMC), a secure digital (SD) card or a USB flash drive.

9. The memory card of claim 6, wherein the memory cell array is a three-dimensional memory cell array.

10. The memory card of claim 6, when each of the plurality of seed groups is stored in different seed tables.

11. The memory card of claim 6, if the plurality of seed groups are stored in an identical seed table and if each of the plurality of seed groups corresponds to one of a plurality of zones including a plurality of entries, then the micro-processor selects a zone from among the plurality of zones based on the part of the bits, and the micro-processor selects from among a plurality of entries included in the selected zone an entry designated by an entry pointer as the selected seed, and then increases the entry pointer to a next entry in the selected zone.

12. A three-dimensional memory system comprising:
a three-dimensional non-volatile memory device including a plurality of layers each layer having a plurality of pages; and
a memory controller controlling an access operation of the three-dimensional non-volatile memory device,
wherein the memory controller comprises:
a micro-processor configured to:
select a first seed group corresponding to a first page to be programmed from among a plurality of seed groups based on part of bits of a page address of the first page, where each of seed groups stores a plurality of seeds, and
select a seed anion the plurality of seeds included in the selected first seed group; and
a randomizer configured to generate a pseudo random number by using the selected seed, to pseudo-randomize data to be programmed in the first page based on the generated pseudo-random number to generate pseudo-randomized data, and to output the pseudo-randomized data to the non-volatile memory device.

13. The memory system of claim 12, wherein the micro-processor selects, from among a plurality of entries included in the first seed group, an entry designated by an entry pointer as the selected seed, and then increases the entry pointer to a next entry in the first seed group storing a seed different from the selected seed.

14. The memory system of claim 12, when each of the plurality of seed groups is stored in different seed tables.

15. The memory system of claim 12, if the plurality of seed groups are stored in an identical seed table and if each of the plurality of seed groups corresponds to one of a plurality of zones including a plurality of entries, then the micro-processor selects a zone from among the plurality of zones based on the part of the bits, and the micro-processor selects from among a plurality of entries included in the selected zone an entry designated by an entry pointer as the selected seed, and then increases the entry pointer to a next entry in the selected zone.

16. The memory system of claim 12, wherein the memory system is embodied as a multi-chip package including a first chip implementing the non-volatile memory device and a second chip implementing the memory controller.

17. The memory system of claim 1, wherein the micro-processor is further configured to:
select a second seed group corresponding to a second page different from the first page from among the plurality of seed groups based on part of bits of a page address of the second page, where the second seed group is different from the first seed group, and
select a seed for the second page included in the selected second seed group.

18. The memory card of claim 6, wherein the micro-processor is further configured to:
select a second seed group corresponding to a second page different from the first page from among the plurality of seed groups based on part of bits of a page address of the second page, where the second seed group is different from the first seed group, and
select a seed for the second page included in the selected second seed group.

19. The three-dimensional memory system of claim 12, wherein the micro-processor is further configured to:
select a second seed group corresponding to a second page different from the first page from among the plurality of seed groups based on part of bits of a page address of the second page, where the second seed group is different from the first seed group, and select a seed for the second page included in the selected second seed group.

20. The memory system of claim 1, wherein the plurality of seed groups are different from each other.

* * * * *